United States Patent [19]
Akioka et al.

[11] Patent Number: 5,373,469
[45] Date of Patent: Dec. 13, 1994

[54] DIFFERENTIAL AMPLIFIER WITH A LATCHING FUNCTION AND A MEMORY APPARATUS EMPLOYING SAME

[75] Inventors: Takashi Akioka, Hitachi; Noboru Akiyama; Yutaka Kobayashi, both of Katsuta; Tatsuyuki Ohta, Niigata; Koyo Katsura, Hitachiota, all of Japan

[73] Assignee: Hitachi, Ltd., Tokyo, Japan

[21] Appl. No.: 890,260

[22] Filed: May 29, 1992

[30] Foreign Application Priority Data

May 31, 1991 [JP] Japan .................................. 3-129050

[51] Int. Cl.⁵ ...................... G11C 7/00; H03K 19/086
[52] U.S. Cl. .................... 365/189.05; 327/57; 326/62
[58] Field of Search .............. 307/260, 455, 475, 530; 365/189.05

[56] References Cited

U.S. PATENT DOCUMENTS 5,200,651 4/1993 Komatsu et al. .................... 307/455

*Primary Examiner*—Eugene R. LaRoche
*Assistant Examiner*—F. Niranjan
*Attorney, Agent, or Firm*—Antonelli, Terry, Stout & Kraus

[57] ABSTRACT

A high-speed memory employing the pipeline technique is disclosed, in which the minimum operating cycle time is reduced by use of a latch circuit for a small signal using a bipolar transistor. A small-signal latch circuit operating at a signal smaller than an output signal level is inserted between an amplifier circuit for amplifying the data held in a memory cell circuit and an output buffer circuit. A switch signal is also interposed between the latch circuit and the amplifier circuit, thereby shortening the cycle time.

13 Claims, 22 Drawing Sheets

NUMERALS INDICATE ADDRESSES OF PICTURE ELEMENT MEMORY

REFRESH MODE

HIGH-SPEED MODE

DIFFERENTIAL AMPLIFIER WITH A LATCHING FUNCTION AND A MEMORY APPARATUS EMPLOYING SAME

BACKGROUND OF THE INVENTION

The present invention relates to a differential amplifier and a latch circuit using the same amplifier and a memory system using the same latch circuit, or more in particular to a memory system using the pipeline technique and a method of reading information therefrom.

The pipeline technique is used widely for high-speed data processing in a logic LSI including a microprocessor. Application of the pipeline technique to the memory LSI to realize a high-speed memory LSI is disclosed, for example, in JP-A-61-237289 and an article entitled "Pipeline Architecture for Fast CMOS BUFFER RAM's" pp. 741 to 747, Journal of Solid State Circuit, June 1990. Specifically, a dynamic random access memory (DRAM) and a static random access memory (SRAM) with latch circuits interposed for provisionally storing a bit of information between a row decoder and a driver circuit, between the driver circuit and a memory array, between the memory array and a plurality of sense amplifiers and between the sense amplifiers and a multiplexer are disclosed.

The conventional memory systems with latch circuits arranged at given points for shortening the cycle time are impossible to improve in speed remarkably.

In other words, the memory system disclosed in JP-A-55-138908 is a DRAM which has a unique operation of rewriting a data. The data rewrite time is normally as long as about twice the access time, and the memory cycle time is dependent on the rewrite time. This prevents the memory cycle time from being shortened even when a latch circuit is interposed between a memory array and sense amplifiers.

The SRAM described in "Pipeline Architecture for Fast CMOS BUFFER RAM", pp. 741 to 747, Journal of Solid State Circuit, June 1990, on the other hand, uses the entire internal signal amplitude as a full amplitude of a CMOS. As a result, the operating time (time required for discharge) of a latch circuit increases, and therefore the cycle time is shortened only slightly by the latch circuit. Also, the number of latch circuits for shortening the cycle time is increased, thereby substantially lengthening the entire access time. Such a SRAM inevitably uses a memory cell having a substantially large cell size, and it is difficult to realize a large-capacity memory due to the chip size.

In the conventional pipeline systems which generally use a latch circuit of a master-slave type, it might be impossible to shorten the cycle time if the delay time of the entire system is shortened due to a large delay time of the circuit.

Further, if the memory cycle time is to be shortened to improve the operating speed, it is necessary to reduce the propagation delay time between the latch circuits in the memory system. In a RAM operating at a very high speed, the amplitude of a memory cell data is normally held at a small value (30 mV, for example) in order to reduce the propagation delay time. It has been impossible in the conventional latch circuits to insert a latch at a point with such a small signal amplitude in a sense amplifier, thereby making it difficult to realize a pipeline RAM with a short cycle time.

SUMMARY OF THE INVENTION

An object of the present invention is to provide a memory system using the pipeline technique and a method of reading information.

Specifically, an object of the present invention is to provide a memory system and a semiconductor memory system reduced in cycle time remarkably by shortening the sensing time of a memory data cell.

Another object of the present invention is to provide a memory system capable of operation even with a low source voltage of about 2.5 V and a method of reading information therefrom.

Still another object of the present invention is to provide a high-speed latch circuit and a memory system using the same latch circuit.

A further object of the present invention is to provide a high-speed differential amplifier circuit.

A still further object of the present invention is to provide a latch circuit capable of being operated at high speed even in a range of low source voltage.

According to a first aspect of the present invention, there is provided a latch circuit comprising a first power terminal, a second power terminal having a potential different from that of the first power terminal, a first bipolar transistor with the collector thereof connected to the first power terminal through a first resistor, a second bipolar transistor with the collector thereof connected to the first power terminal through a second resistor, the emitters of the first and second bipolar transistors being connected to each other on the one hand and to the second power terminal through a series circuit including a first MOS transistor and a first constant current source on the other hand, the base of one of the bipolar transistors being connected to the collector of the other bipolar transistor and vice versa, input terminals connected to the junction point of the first bipolar transistor and the first resistor and to the junction point of the second bipolar transistor and the second resistor respectively, output terminals connected to the junction point of the first bipolar transistor and the first resistor and to the junction point of the second bipolar transistor and the second resistor respectively, a latch signal input terminal connected to the gate of the first MOS transistor.

According to a second aspect of the present invention, there is provided a latch circuit comprising a first power terminal, a second power terminal having a different potential from that of the first power terminal, a first bipolar transistor with the collector thereof connected through a first resistor to the first power terminal, a second bipolar transistor with the collector thereof connected through a second resistor to the second power terminal, the emitters of the first and second bipolar transistors being connected to each other on the one hand and to the second power terminal through a series circuit including a first MOS transistor and a first constant current source on the other hand, the base of one of the bipolar transistors being connected to the collector of the other bipolar transistor and vice versa, a third bipolar transistor with the collector thereof connected to the junction point of the first bipolar transistor and the second resistor, a fourth bipolar transistor with the collector thereof connected to the junction point of the second bipolar transistor and the second resistor, the emitters of the third and fourth bipolar transistors being connected to each other on the one hand and to the second power terminal through a series circuit including a second MOS transistor and a second constant current source on the other hand, data input terminals connected to the bases of the third and fourth bipolar transistors respectively, data output terminals connected to the junction point of the first bipolar transistor and the first resistor and that of the second bipolar transistor and the second resistor respectively, a latch signal input terminal connected to the gate of the first MOS transistor, and a through signal input terminal connected to the gate of the second MOS transistor. In order to secure an improved operating speed, according to this latch circuit, it is possible to connect third and fourth MOS transistors of a conduction type different from the first MOS transistor connected in series between the first power terminal and the emitters of the first and second bipolar transistors, to connect the gate of the third MOS transistor directly and the gate of the fourth MOS transistor indirectly through an inverter to the latch signal input terminal, to connect in parallel to each other series-connected fifth and sixth MOS transistors and a series circuit including the second MOS transistor and the second constant current source, and also to connect the gate of a fifth MOS transistor directly and that of a sixth MOS transistor indirectly through an inverter to the through signal input terminal. At the same time, it is important to set the logic threshold of the inverter to a value higher than the central value of the voltage amplitude of the latch signal for the former case, and to a value higher than that of the through signal for the latter case.

According to a third aspect of the present invention, there is provided a memory system comprising a circuit for amplifying and outputting information held in a memory cell, a circuit for holding information temporarily at a signal level lower than an output signal amplitude level or an output voltage (or current) in the process of amplifying to the output voltage (or current) level or the output signal amplitude level, and a circuit for connecting or disconnecting the latch circuit selectively to or from the front stage thereof.

The feature of a semiconductor memory system lies in that it comprises a memory array including a multiplicity of memory cell rows, a pre-sense amplifier for each memory cell row or rows, an output buffer for each of the pre-sense amplifiers, first and second bipolar transistors interposed between the pre-sense amplifiers and the output buffers and in the same number as the output buffers, the collectors of the bipolar transistors being connected through first and second resistors respectively to the first power terminal, the emitters of the first and second bipolar transistors being connected to each other on the one hand and to a second power terminal different in potential from the first power terminal through a series circuit including a first MOS transistor and a first constant current source on the other hand, the base of one of the bipolar transistors being connected to the collector of the other bipolar transistor and vice versa, the base-collector junction points of the first and second bipolar transistors being connected to the input terminals of the output buffers respectively, a third bipolar transistor with the collector thereof connected to the junction point of the first bipolar transistor and the first resistor, a fourth bipolar transistor with the collector thereof connected to the junction point of the second bipolar transistor and the second resistor, the emitters of the third and fourth bipolar transistors being connected to each other on the one hand and to the second power source through a series circuit including a second MOS transistor and a second constant current source on the other hand, the bases of the third and fourth bipolar transistors being connected to the output terminals of the pre-sense amplifiers, a latch signal input terminal connected to the gate of the first MOS transistor, and a through signal input terminal connected to the gate of the second MOS transistor. It is possible also in this case to modify the memory system as in the above-mentioned latch circuit to improve the operating speed.

A latch circuit configured as described above is capable of being operated with a small signal amplitude of the circuit at high speed. The reason is that (1) there are only a few devices such as bipolar transistors used in the paths for passing the data, thereby simplifying the circuit configuration with a smaller number of circuit stages, (2) the signal amplitude can be reduced under a through condition without taking the latch stability into consideration, and (3) the current can be increased only during the transition of an output signal by a speed-up circuit for passing a pulse current through a MOS transistor connected in series.

A memory system configured as described above comprises a latch circuit operated with a small amplitude in a small-amplitude region (a sense amplifier circuit of a memory cell data). As a result, a latch circuit may be inserted in a small-amplitude region accounting for a considerable portion of the access time of the memory system, thereby remarkably reducing the cycle time.

DESCRIPTION OF THE PREFERRED EMBODIMENTS

[Embodiment 1]

A current switch A constituting a latch circuit according to a first embodiment of the present invention will be described with reference to FIG. 2.

Figure 2:
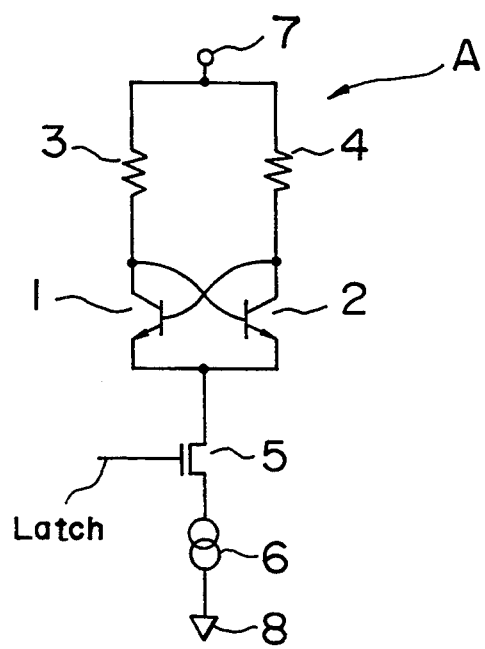
FIG. 2 is a circuit diagram showing a differential amplifier having the latch function according to the present invention.

In FIG. 2 showing a current switch A of a self-latch bipolar transistor type, reference numerals 1 and 2 designate two bipolar transistors forming a differential amplifier with the base of one of them connected to the collector of the other and vice versa, and with the emitters thereof connected to each other. Numerals 3 and 4 designate current-voltage converters (resistors) inserted between the junction points of the bases and collectors of the bipolar transistors and a power node on high potential side 7 to make up a load of the differential amplifier. Numeral 5 designates an N-channel MOS transistor connected to the junction point between the emitters of the bipolar transistors for controlling the current flowing in the current switch circuit, and numeral 6 a constant current source inserted between the N-channel MOS transistor 5 and a power node on low potential side 8 for securing a constant amount of the current flowing in the current switch A. Character "Latch" designates a terminal latch connected to the gate of the N-channel MOS transistor 5 for applying a signal to energize the latch circuit.

The operation of the latch circuit will be described. When the constant-current source 6 is turned on with a voltage applied from the high potential-side power node 7 to the collectors of the bipolar transistors 1 and 2, the latch circuit is energized to latch a data at the collectors of the two bipolar transistors in such a manner as to hold relative potentials thereof. In this case, an actual signal potential amplitude between the collectors is determined by the product of the current due to the constant-current source 6 and the resistance of the resistors 3 and 4.

When the potential amplitude is set to a value larger than the forward voltage drop (Vbe, about 0.8 V) of the bipolar transistors 1, 2, the bipolar transistor 1 or 2 of the latch circuit enters a deep saturation region. Therefore, the turning off of the latch circuit is retarded, thereby reducing the operating maximum frequency thereof. It is thus necessary to hold the potential amplitude below 0.7 V in order to achieve a high-speed operation. The smaller the potential amplitude, the lower the operating maximum frequency. The potential amplitude is therefore set in consideration of applications of the latch circuit.

The advantage of the present embodiment is that when the current of the latch is released for controlling the current of a MOS transistor by the same transistor, i.e., when the MOS transistor 5 is turned off, the collectors of the bipolar transistors 1 and 2 float, and therefore "through" and "latch" states are easily realized.

[Embodiment 2]

Figure 3:
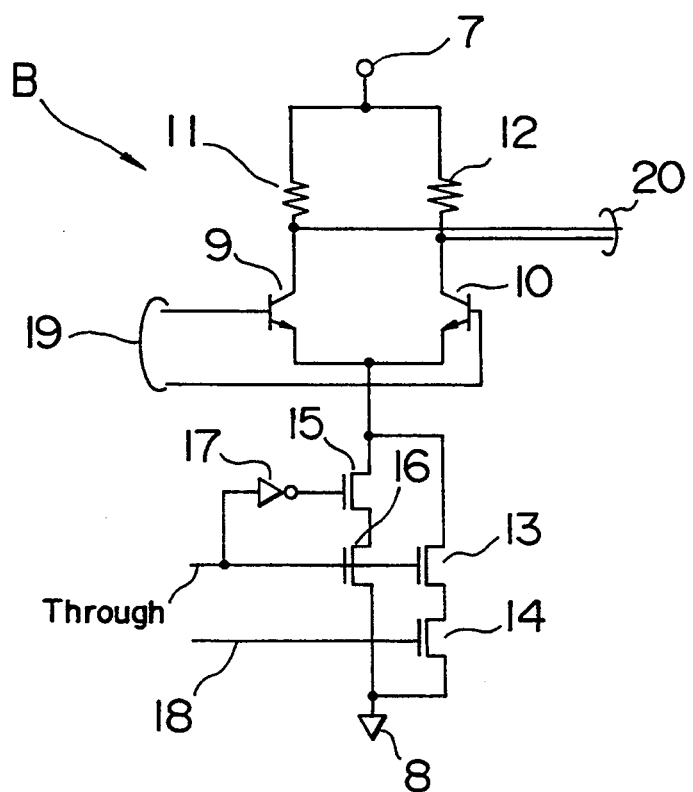
FIG. 3 is a circuit diagram showing a differential amplifier improved in the operating speed.

An embodiment of a current switch B constituting a latch circuit according to the present invention is shown in FIG. 3.

The current switch shown in FIG. 3 is for a bipolar transistor. The configuration and operation of this switch will be explained. Numerals 9 and 10 designate two bipolar transistors with the emitters thereof connected to each other for making up a current switch B. Numerals 11 and 12 designate current-voltage converters (resistors) inserted between the collectors of the bipolar transistors and a high-potential side power node 7. Numerals 13 and 14 designate first and second MOS transistors in series with each other and connected between the junction point of the emitters of the bipolar transistors and the low-potential power node for controlling the current of the current switch B. The second MOS transistor constitutes a constant current source for the current switch B. Numerals 15 and 16 designate third and fourth MOS transistors in series with each other and connected in parallel to the MOS transistors 13 and 14. Numeral 17 designates an inverter made up of a CMOS transistor and the like and has the logical threshold thereof set to a level higher than the central value of the voltage amplitude of a through signal. When the through signal begins to change to a high level, therefore, the MOS transistor 16 turns on and a through current flows in pulse form in the MOS transistors 15 and 16 until the inverter 17 turns off. This pulse current improves the operating speed for turning on the latch circuit. Numeral 18 designates a control terminal for the MOS transistor (constant current source) 14. This control terminal is normally set to about the voltage (Vth, threshold voltage) of the MOS transistor 14 to energize the same transistor in a saturation region. Characters "through" designates a terminal Through connected to the third MOS transistor 15 via the inverter 17 and the gates of the first and fourth MOS transistors 13 and 16 for applying a control signal to determine whether the current switch B is selected to produce an output. Numeral 19 designates a data input terminal for the current switch B, and numeral 20 a data output terminal for current switch B.

The current switch B amplifies a differential signal applied to the data input terminal 19 to an amplitude determined by the resistance of the resistors 11, 12 and the current value of the constant-current source 14 and outputs to the data output terminal 20. In the selected operating state, the control terminal 18 is supplied with a constant voltage of, say, about 1 V, and the MOS transistor 14 functions as a constant current source. Also, a high-level voltage indicative of the fact that the current switch B is selected is applied to the terminal Through, an input voltage is supplied to the data input terminal 19, and an output voltage is produced at data output terminal 20.

Figure 4A:
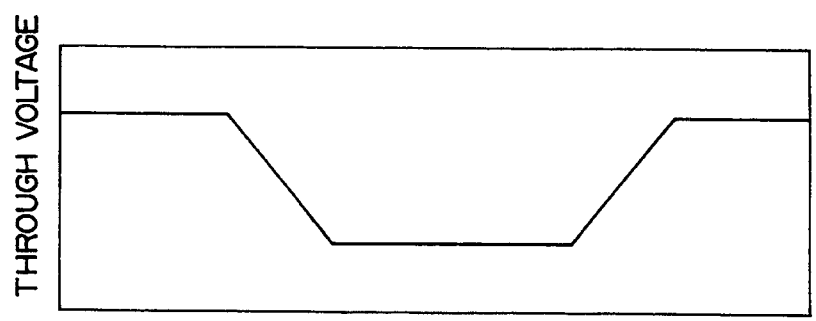
FIGS. 4A to 4D are diagrams showing a waveform of operation of a differential amplifier according to the present invention.
Figure 4B:
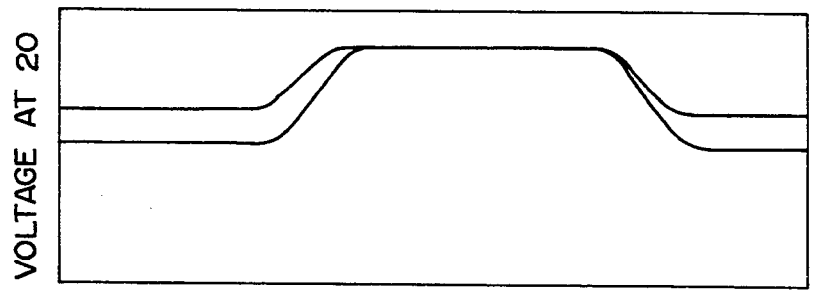

FIGS. 4A to 4D show waveforms of operation of the current switch B according to the present embodiment. In turning off the current switch B, the voltage of the terminal Through is reduced to low level in FIG. 4A. As a result, the MOS transistor 13 is turned off, and the current path is cut off, so that as shown in FIG. 4B, the output potential at the data output terminal 20 is increased by the resistors 11 and 12 regardless of the input voltage value, thereby turning off the current switch B.

Figure 4C:
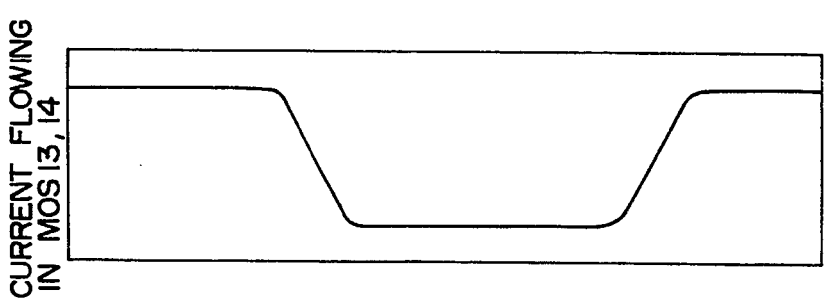
Figure 4D:
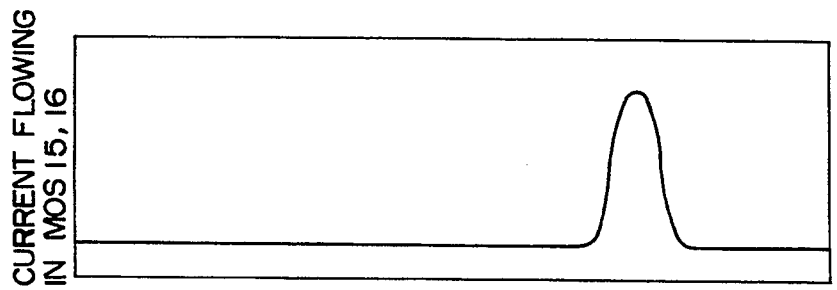

When turning on the circuit, on the other hand, the voltage of the terminal Through is raised to high level as shown in FIG. 4C and the MOS transistor 13 is thus turned on to start a current flow. This current assumes a constant value determined by the MOS transistor 14, and constitutes a trade-off with the magnitude of the current for reducing the voltage of the data output terminal 20 when it is desired to dampen the current value by controlling the magnitude of the MOS transistor 14 due to the conditions for restricting power consumption or the like. In the current switch B, therefore, paths for the MOS transistors 15 and 16 are formed in parallel to the path for the MOS transistor 14 to supply a current only during the transfer from Off to On state as shown in FIG. 4D, thereby accelerating the potential drop at the data output terminal 20.

The present embodiment thus has the advantage that the fall at the output node can be improved in speed in the process of transfer from Off to On state without increasing the power consumption of the current switch B.

The third and fourth MOS transistors 15 and 16 connected in parallel to the MOS transistors 13 and 14 and the inverter 17 may be eliminated with equal effect when the operating frequency for an intended application is sufficiently low.

[Embodiment 3]

A latch circuit according to an embodiment of the present invention will be explained with reference to FIG. 1.

Figure 1:
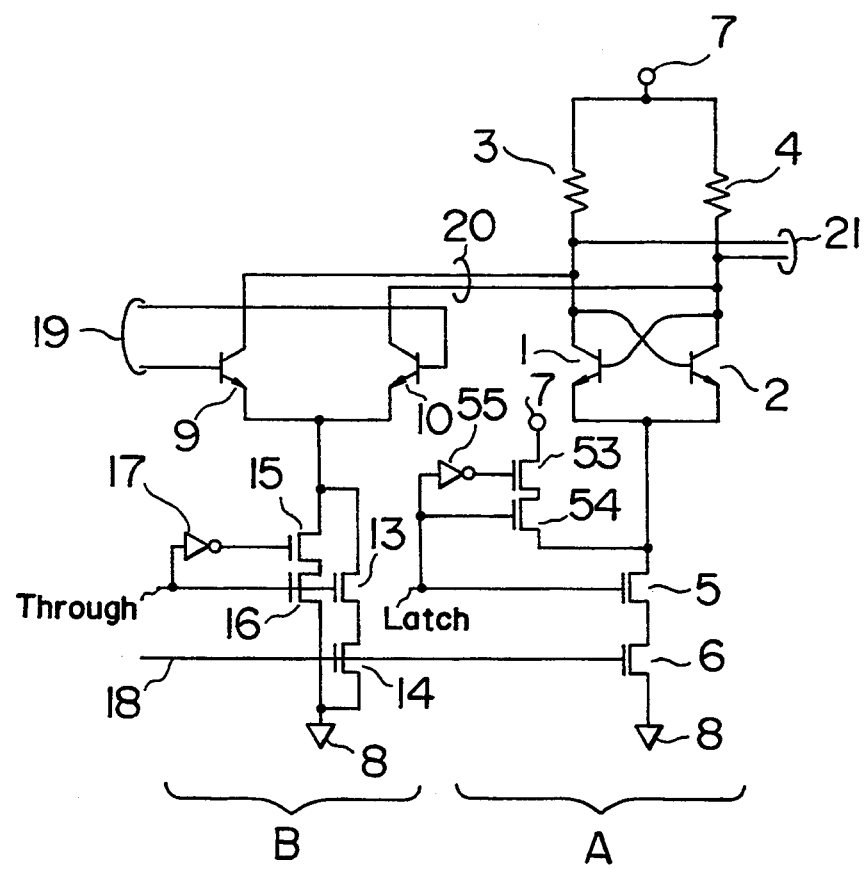
FIG. 1 is a circuit diagram showing an example of a latch circuit according to the present invention.

The latch circuit shown in FIG. 1 is a combination of the current switch A shown in FIG. 2 and the current switch B shown in FIG. 3. The collectors of the bipolar transistors 9 and 10 are inserted between the resistors 3, 4 of the current switch A and the bipolar transistors 1, 2 in order that the resistors 3 and 4 of the current switch A may double as resistors for the current switch B. Numeral 21 designates a data introduction terminal of a latch circuit led out from between the resistors 3, 4 of the current switch A and the bipolar transistors 1, 2. Numerals 53 and 54 designate seventh and eighth MOS transistors connected in series with each other, with an end thereof connected to the high-potential power node 7 and the other end thereof between the junction point of the emitters and the gate of the MOS transistor 53. The gate of the MOS transistor 53 is connected through an inverter 55, and that of the MOS transistor directly, to the terminal Latch. The MOS transistors 53, 54 function to cut off the current in the bipolar transistors 1, 2 rapidly when departing from a latched state. The control terminal 18 is also connected to the gate of the MOS transistor 6.

When the latch circuit according to the present embodiment is used in a "through" state, the "through" current switch B is supplied with a current with the terminal Through increased to high level and the terminal Latch set to low level. As a consequence, the differential input signal applied to the data input terminal 19 is amplified and outputted to the data output terminal 20. When a latched state is desired, on the other hand, the "latch" current switch A is supplied with a current with the terminal Latch set at high level and the terminal Through at low level. A data is thus latched in the collectors of the bipolar transistors 1, 2 as explained with reference to Embodiment 1. When changing from latched to "through" state, as described with reference to Embodiment 2, the MOS transistors 15 and 16 are supplied with a pulse current with the change thereof speed up. In the transfer from "through" to latched state, by contrast, the MOS transistors 53 and 54 lift the emitter potential of the bipolar transistors 1 and 2 thereby to increase the change thereof. This operation is attained by setting the logical threshold of the inverter 55 to a level lower than the central value of voltage amplitude of the latch signal.

According to the latch circuit under consideration, the voltage amplitude of the differential signal of data output in "through" state is determined by the resistance values of the resistors 3, 4, the value of the current flowing in the constant-current source 14 and the amplitude of the input differential signal. The voltage amplitude of the differential signal of the data output in latched state, on the other hand, is dependent on the resistance values of the resistors 3, 4 and the value of the current flowing in the constant-current source 6. These amplitudes are therefore determinable independently of each other. Also, in view of the fact that the delay time generally decreases with the decrease in the signal amplitude, the system may be configured in such a way that the output amplitude is reduced according to the conditions specified above under a "through" state, and the amplitude is increased to latch the data in stable manner under a latched state. Assuming that the latch output amplitude is set to 0.1 V in latched state and to 30 mV in "through" state, for instance, the delay time under "through" state is shortened while at the same time realizing a stable latch operation. Specifically, since the constant-current sources 6 and 14 are controlled by the same control signal, the capacity of the transistor making up the constant-current source 6 can be increased beyond that of the constant-current source 14.

Figure 5:
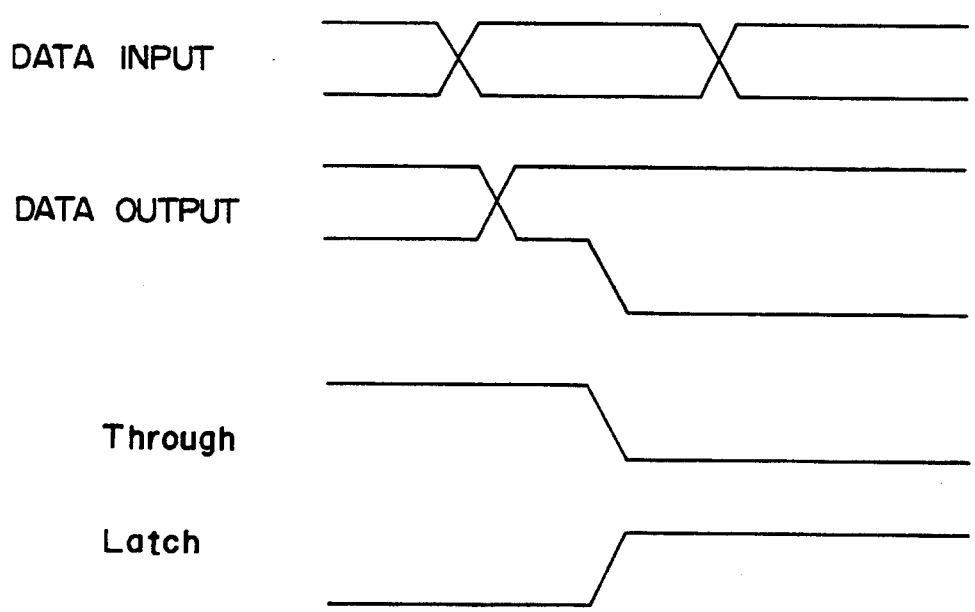
FIG. 5 is a diagram showing an example of the waveform of operation of the latch circuit shown in FIG. 1.

Waveforms of operation of a latch circuit according to the present embodiment are shown in FIG. 5. The circuit operation is changed from "through" to "latched" state. In latched state, the amplitude of the data output is expanded to secure a stable data latch. It is necessary that the minimum voltage that can hold a stable latched state be set to produce an amplitude of a differential amplifier subjected to negative feedback.

The control to change the amplitude between latched and "through" states is made possible according to the present embodiment by the fact that the current source for supplying a current to a differential amplifier to hold a latched state is isolated from that for supplying a current to a differential amplifier to amplify the data under "through" state, and the current values for the two current sources can be set independently of each other.

The latch circuit according to the present embodiment is advantageous in that the signal amplitude of the circuit is small and a high-speed operation is possible. The reasons are that (1) there are a fewer number of devices including bipolar transistors used for data paths, thereby simplifying the circuit configuration and reducing the number of stages, while at the same time minimizing the parasitic capacitance to be charged or discharged at the time of operation, (2) the signal amplitude under a "through" state is capable of being reduced without taking the latch stability into consideration, and that (3) it is possible to increase the current only at the time of transition of an output signal by a speed-up circuit including a MOS transistor connected in series for supplying a pulse current.

Another advantage of the present embodiment lies in that a latch circuit having a high-speed "through" data propagation delay time is obtained by changing and optimizing the signal amplitude of an output between "through" and latched states.

[Embodiment 4]

Figure 6:
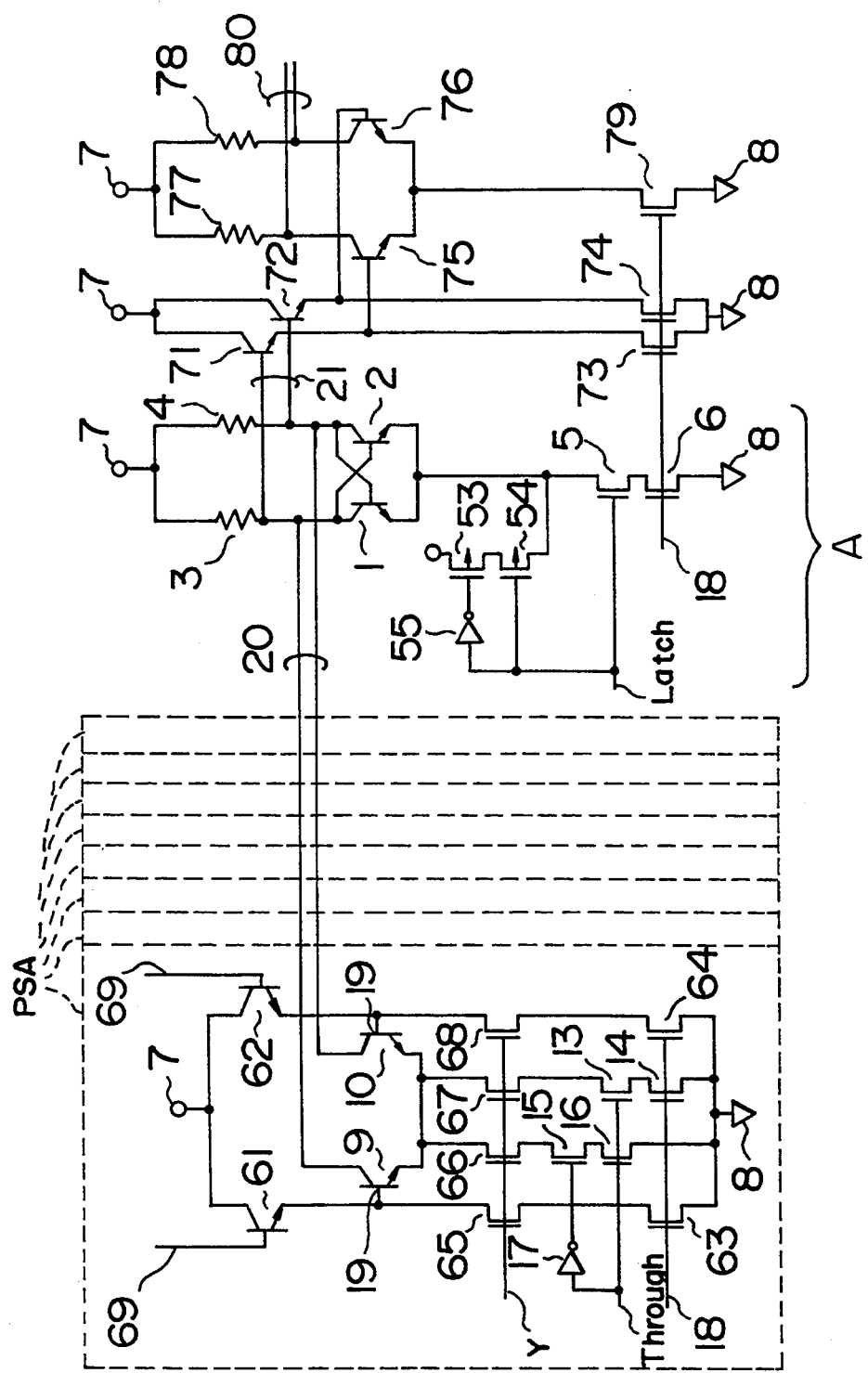
FIG. 6 is a circuit diagram showing a sense amplifier of a memory system of pipeline type to which the present invention is applied.

An embodiment in which a latch circuit according to the present invention is applied to a sense amplifier of a memory integrated circuit is shown in FIG. 6.

Characters PSA designates pre-sense amplifiers arranged for each memory cell row. A single pre-sense amplifier is shown in the drawing. The pre-sense amplifier is comprised of bipolar transistors 61 and 62 on the side of a data input terminal 19 of the current switch B shown in FIG. 1 as a level converter circuit for level conversion and application of a differential input data from the memory cell rows. The bipolar transistors 61 and 62 have collectors connected to a high-potential power node 7, bases to a memory cell, and emitters to a low-potential power node 8 through two sets of MOS transistors 65, 63 and 68, 64 in series. MOS transistors 66 and 67 are interposed between the junction point of the emitters of the bipolar transistors 9, 10 and the MOS transistors 15, 13. MOS transistors 65, 66, 67 and 68 are driven by a terminal Y for applying a column selection signal for selecting one of a plurality of pre-sense amplifiers PSA. Numeral 69 designates an input terminal of the pre-sense amplifiers PSA to receive data from the memory cell. The data output terminal 20 of the current switch B functions as a data bus (common collector line) for coordinating the outputs of the pre-sense amplifiers PSA. Numerals 71 and 72 designate bipolar transistors having collectors connected to the high-potential power node 7, bases to the data lead-out terminal 21 of the current switch A, and emitters to the low-potential power node 8 through the MOS transistors 73 and 74. These bipolar transistors 71, 72 and the MOS transistors 73, 74 make up a circuit for converting the data output level of the current switch A. Numerals 75 and 76 designate bipolar transistors having collectors thereof connected to the high-potential power node 7 through resistors 77 and 78, bases thereof to the emitters of the bipolar transistors 71 and 72 in the preceding state, and emitters thereof to the low-potential power node 8 through a MOS transistor 79. These bipolar transistors 75, 76, resistors 77, 78 and the MOS transistor 79 constitute a differential amplifier circuit for amplifying the data output of a latch circuit to a differential signal of sufficient magnitude. The level-converting circuit and the differential amplification circuit function as an output buffer circuit or an amplification circuit in a stage preceding to the output buffer circuit. The gates of the MOS transistors 73, 74 and 79 are connected to the control terminal 18. Numeral 80 designates an output terminal of the circuit according to the present embodiment. FIG. 6 shows an example of a sense amplifier circuit of a BiCMOS SRAM with eight pre-sense amplifiers PSA connected to a couple of common collector lines. When the terminal Latch is in "through" state, the data from the memory cell is first applied to the pre-sense amplifier and, through the latch circuit according to the present invention, is outputted as a differential signal to the data output terminal 21. This signal is further transmitted to an output buffer and the like circuit through a level conversion circuit and a differential amplification circuit in subsequent stages. In the process, a signal (column selection signal) for selecting a pre-sense amplifier having a data from the selected memory cell is applied to the terminal Y. When the latch circuit is latched as the next step, the data that is being outputted at the time is latched as it is, and the memory cell selection is changed in such a manner that the preceding data continues to be outputted even under a change of input data.

The advantage of the present embodiment resides in that a latch circuit is incorporated without substantially affecting the speed of the sense amplifier of the conventional high-speed SRAM with the result that a memory can be "pipelined" while maintaining a high-speed operation.

According to this embodiment, the MOS transistors 15, 16, 53, 54, 66 and the inverters 17, 55 may be eliminated when a high-speed operation is not considerably required.

[Embodiment 5]

Figure 7:
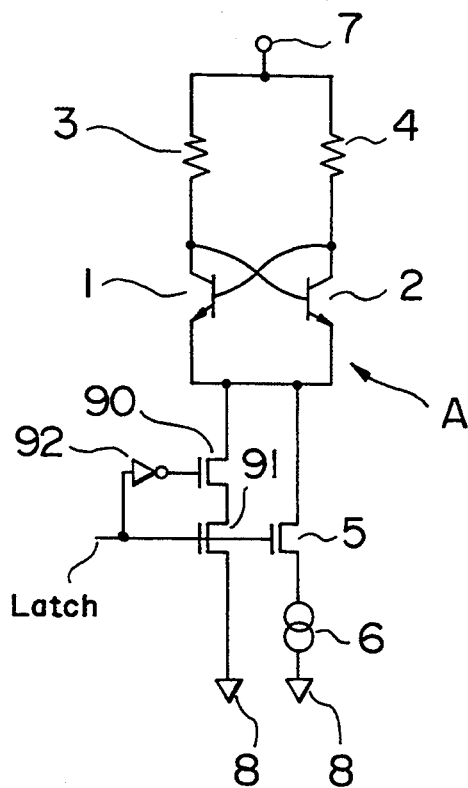
FIG. 7 is a circuit diagram showing an example of another latch circuit according to the present invention.

Another embodiment of the current switch A making up a latch circuit according to the present invention is shown in FIG. 7. This embodiment is further improved in the speed of transformation to a latched state as compared with the current switch A shown in FIG. 2.

The difference of this embodiment from the circuit shown in FIG. 2 is that MOS transistors 90 and 91 in series adapted to turn on alternatively by the terminal Latch are inserted between the common junction point of the emitters of the bipolar transistors 1, 2 and the low-potential power node 8. Numeral 92 designates an inverter comprised of CMOS transistor logics or the like connected between the terminal Latch and the gate of the MOS transistor 90.

When the latch signal is at low level, the gate of the MOS transistor 90 is supplied with a high-level signal. Since the MOS transistor 91 is Off, however, no current flows through these MOS transistors. The logical threshold of the inverter 92 is set to a level lower than the central value of the voltage amplitude of the latch signal. When the latch signal begins to change to high level, the MOS transistor 91 turns on so that a through current flows via the MOS transistor 91. This pulse current continues to flow until the inverter 92 turns off and improves the turn-on speed of the latch circuit.

The current switch A according to the present embodiment may be used to improve the operating speed. In this case, as shown in FIGS. 1 and 6, the current switch A may be used with the MOS transistors 53, 54 and inverter 55.

The latch circuit using the current switch A according to the present embodiment has an advantage in that the turn-on speed of a latch circuit is improved simply by a transient pulse current without increasing the steady current, and therefore the operating speed of a circuit can be improved without increasing the power consumption.

[Embodiment 6]

A pipeline memory using a high-speed sense amplifier with latch as a sense amplifier described with reference to Embodiment 4 and shown in FIG. 6 has necessarily a short cycle time (high speed).

Figure 8:
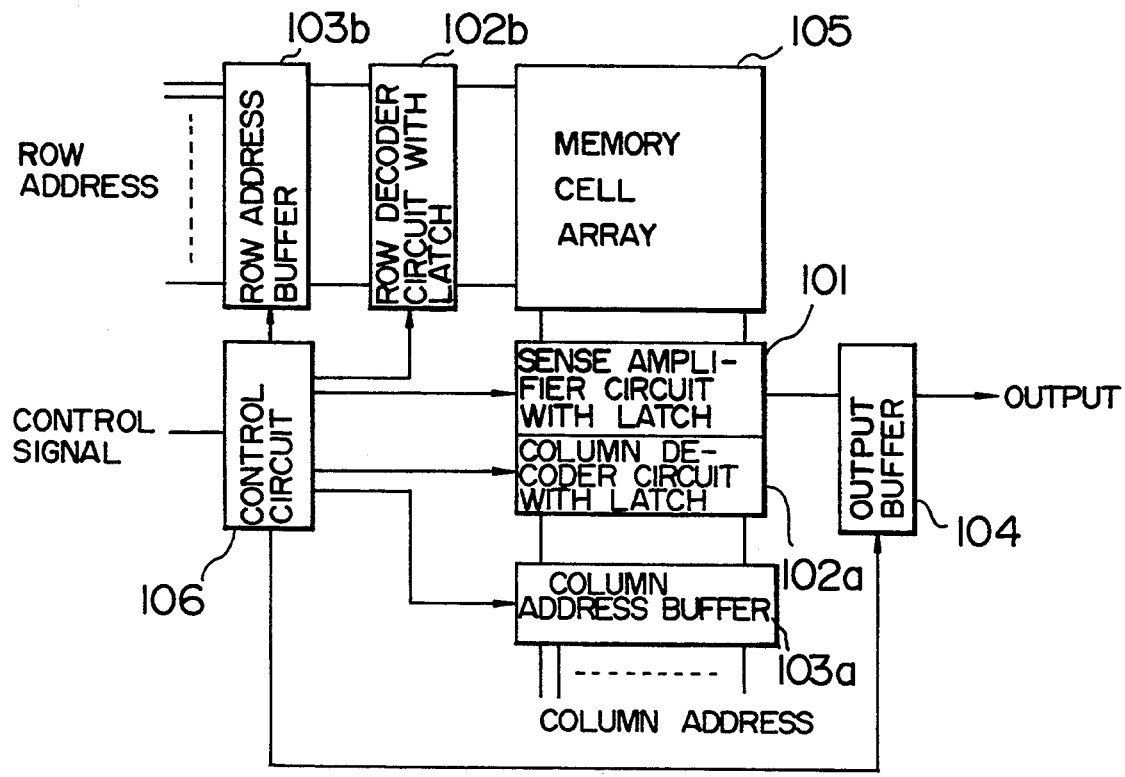
FIG. 8 is a block diagram showing a memory chip of pipeline type according to the present invention.
Figure 9:
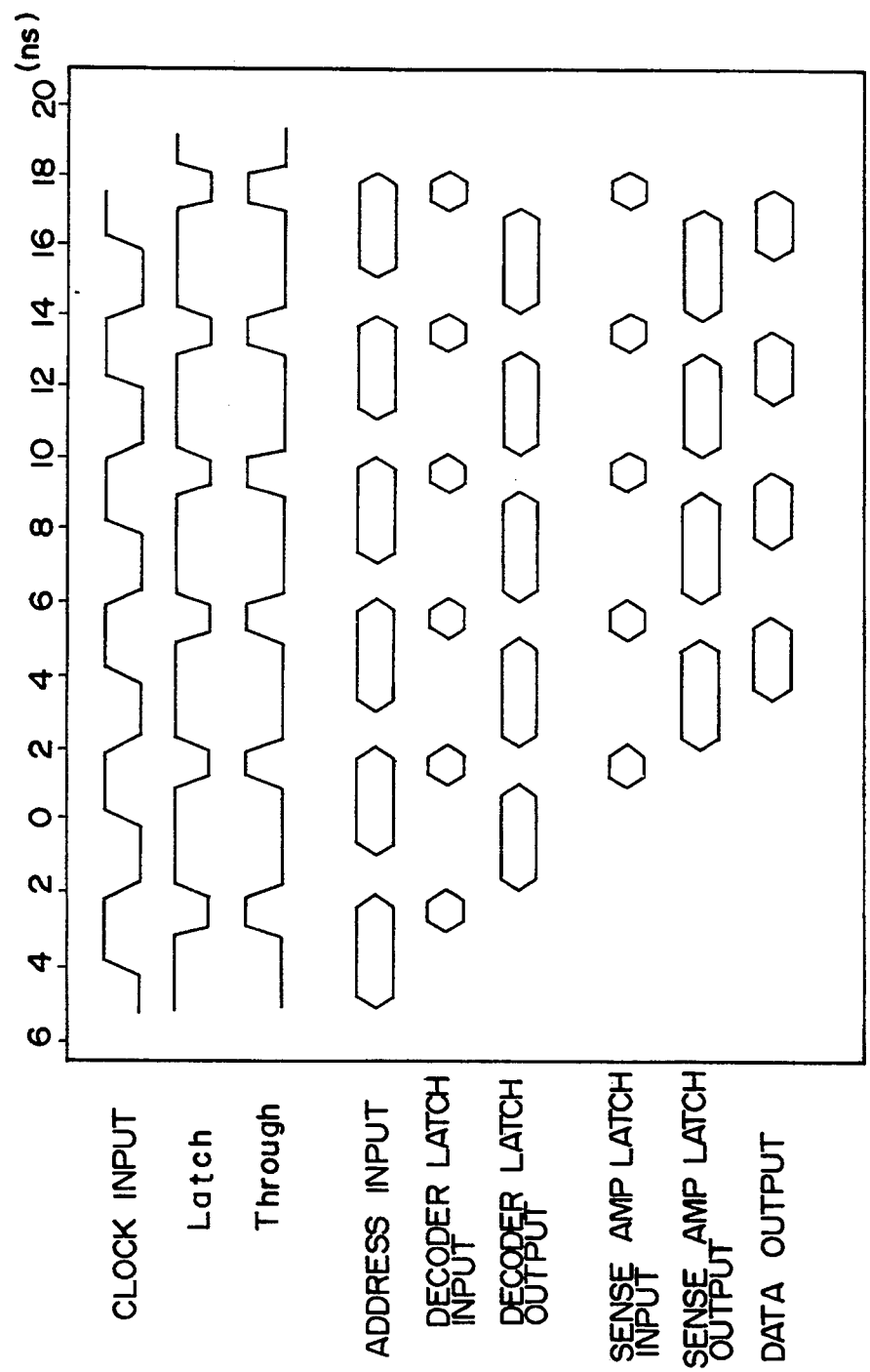
FIG. 9 is a diagram showing a timing chart for a memory of pipeline type according to the present invention.

FIG. 8 is an example of block diagram showing a 16M-bit pipeline SRAM to which a sense amplifier with latch according to Embodiment 4 is applied. This example includes decoders 102a, 102b and a sense amplifier 101 each having a latch circuit and connected to a control circuit 106. As an alternative, a latch circuit may be inserted in the output buffer 104 and row/column address input buffers 103a, 103b in four stages to improve the set-up hold characteristic of the input and output. FIG. 9 is a timing chart of operation for a configuration having a two-stage latch circuit inserted in a sense amplifier and a 16M-bit SRAM decoder.

In order to reduce the cycle time of pipeline operation, it is necessary to shorten the delay time to the latch circuit of the sense amplifier 101 from the latch circuits of the decodes 102a, 102b. The latch circuit for controlling the pipeline is controlled by the clock signal supplied from an external source and the latch signal and the "through" signal internally produced. The sense amplifier 101 with latch is supplied with a differential read data of a very small amplitude (about several mV to 50 mV) from a memory cell array 105 thereby to hold the data in "through" state during the next period of latching when the amplitude is expanded to latch a data in stable fashion.

The effect of a circuit according to the present embodiment is thus seen to lie in that a high-speed sense amplifier circuit having a latch function suitable for a high-speed pipeline memory makes possible a pipeline memory system having a short cycle time (high-speed operation).

The embodiment is described in case of using SRAM (static random access memory), but DRAM (dynamic random access memory) can be used as well, that is, the circuit diagram shown in FIG. 8 can use not only SRAM, but also DRAM.

[Embodiment 7]

Figure 10:
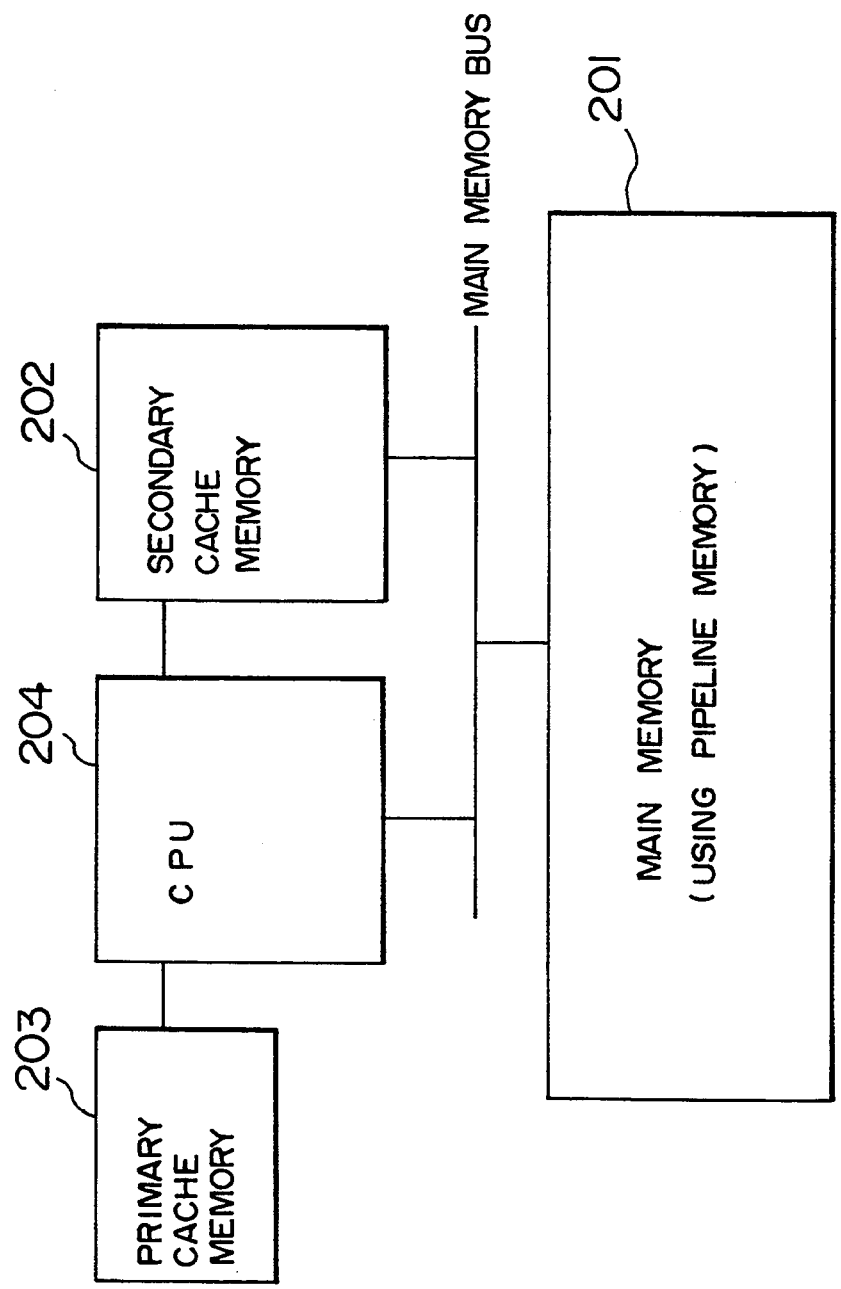
FIG. 10 is a block diagram showing a memory system of a computer using a pipeline memory as a main memory according to the present invention.

A main memory of a computer system having a hierarchal memory system such as for a cache memory may be used with a memory LSI including a sense amplifier circuit built in with a high-speed latch circuit according to the present invention as shown in FIG. 6 as a pipeline memory. FIG. 10 shows an example of a computer memory system using a pipeline memory according to the present invention as the particular main memory. In the configuration of a primary cache memory 203, a CPU 204 and a secondary cache memory 202, the deterioration of the system performance is unavoidable due to the time required for access to the main memory 201 in case of mishit of the secondary cache memory 202. If this deterioration is to be reduced, the cycle time of the main memory 201 is required to be minimized. According to the present system, a pipeline small in cycle time is used for the main memory to increase the transfer speed between the main memory 201 and the secondary cache memory 202 thereby to minimize the deterioration of the system performance due to mishit.

As a result, the time penalty imposed when data transfer from the main memory 201 is required in case of a considerable reduction in the data load time to the secondary cache memory 202 from the main memory 201 and a mishit of the secondary cache memory 202, is minimized, thereby improving the performance of the entire computer system.

Generally speaking, it is also possible to shorten the load time to an overriding hierarchal memory of the memory data by use of a memory always accessed by block in a multi-level cache memory. As a result, the advantage of the present embodiment lies in that the use of a pipeline memory having a short cycle time as mentioned above makes it possible to produce a high-performance computer system having a short cycle time.

[Embodiment 8]

In a memory system which receives blocks in units not always constant like an image memory, a pipeline capable of random access according to the present invention is especially effective.

Figure 11:
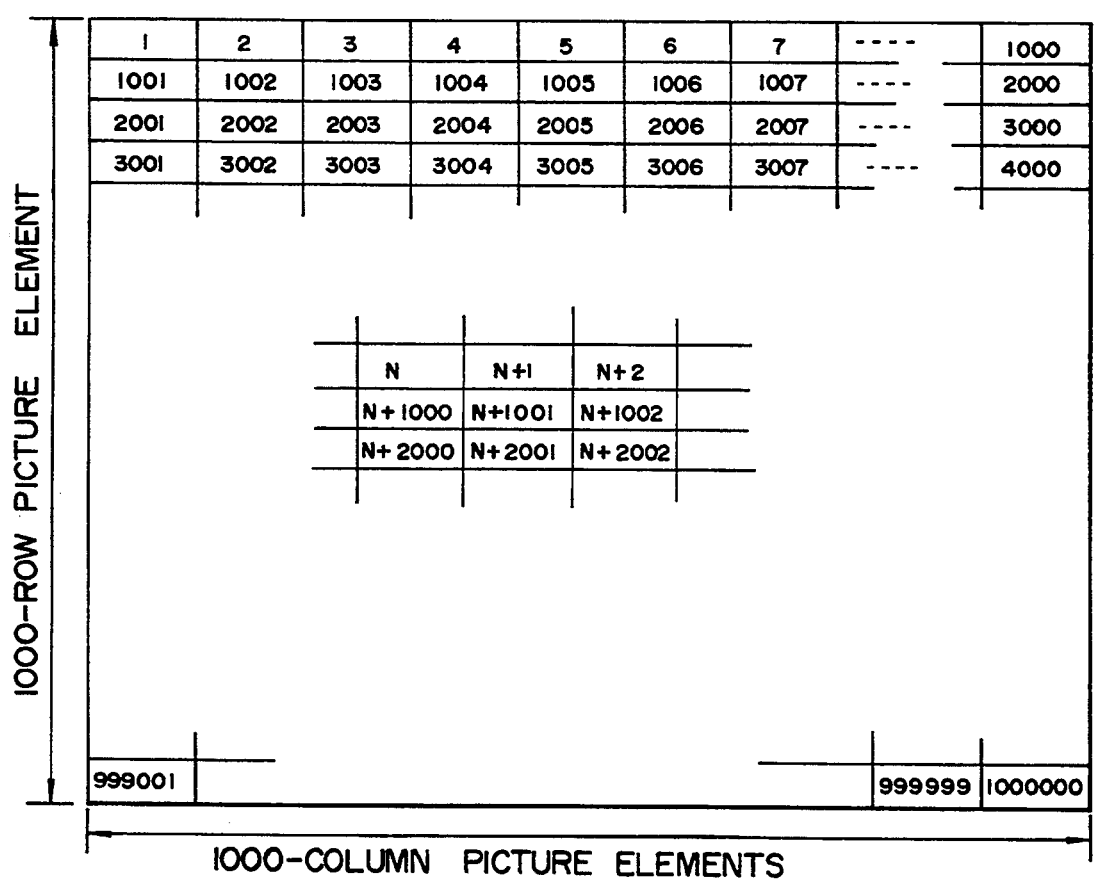
FIG. 11 is a diagram showing a memory address for an image memory using a pipeline memory according to the present invention.

FIG. 11 shows an example of a memory address arrangement of a screen having 1000×1000 picture elements. In the case of accessing nine picture elements including N, N+1, N+2, N+1000, N+1001, N+1002, N+2000, N+2001 and N+2002, the use of a pipeline memory according to the present invention permits access with the same short access time as if it would be possible when the picture elements are arranged in orderly manner. Specifically, since an image memory may be randomly accessed in this system, a free package is made possible only by a pipeline memory according to the present invention capable of random access.

[Embodiment 9]

An embodiment in which the latch circuit of the present invention is applied to a pipeline memory realized with an LSI will be described below.

Figure 12:
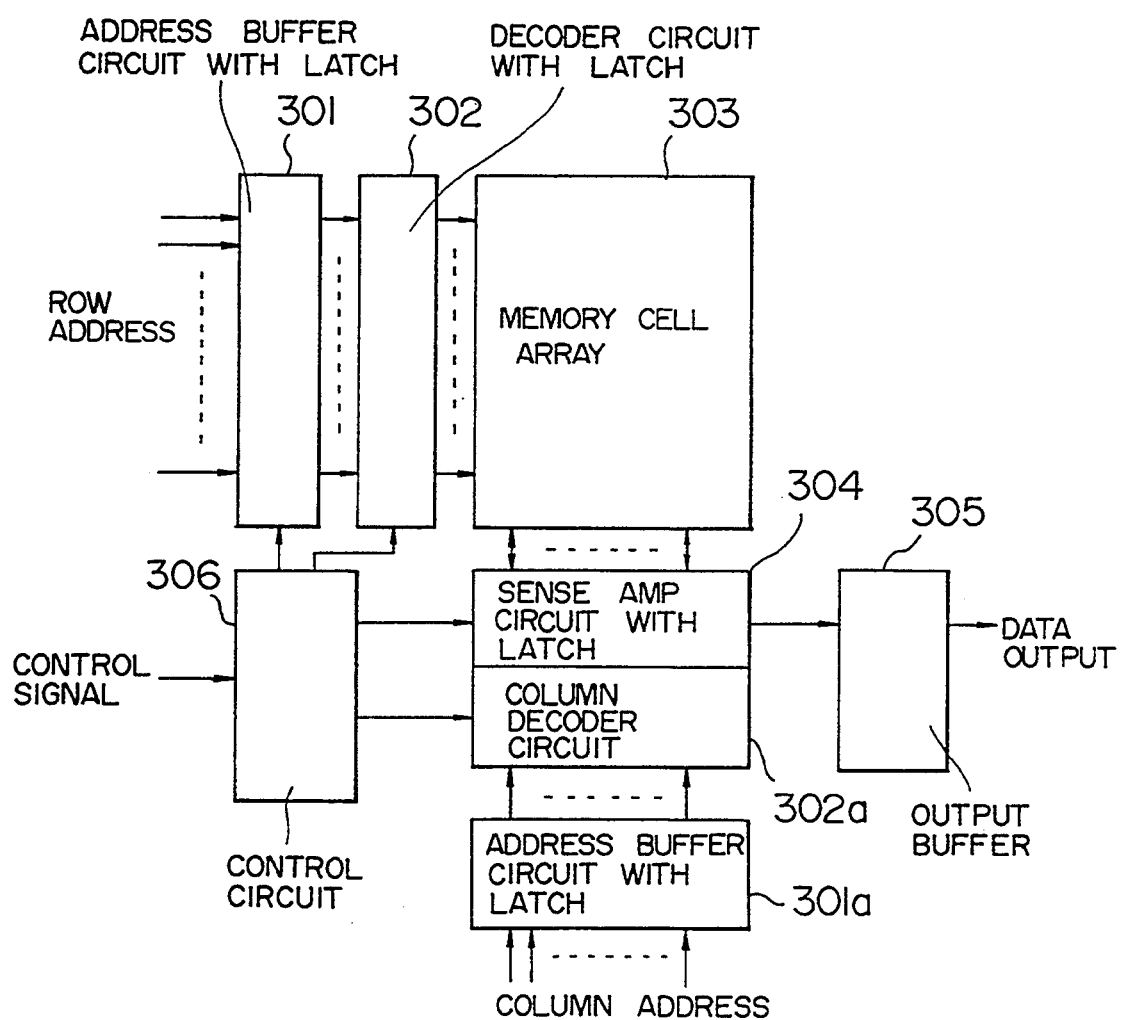
FIG. 12 is a block diagram showing a pipeline memory LSI according to the present invention.
Figure 13:
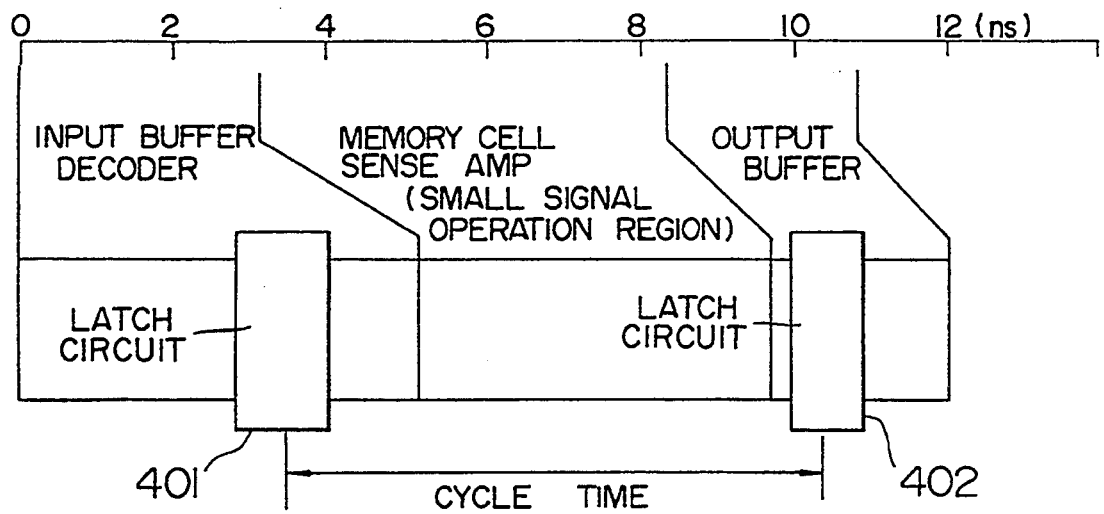
FIG. 13 is a diagram showing a cycle time of a memory of pipeline type according to the prior art.

A block diagram typifying a memory LSI with a pipeline memory according to the present invention is shown in FIG. 12. A data bus for regulating the processing speed is called a critical bus. In FIG. 12, a control circuit 306 causes an address data to be applied through a buffer circuit 301 with a latch to a decoder circuit 302 with a latch, and a decoded signal is inputted to a memory cell array 303. A signal from a selected memory cell is amplified at a sense amplifier 304 with a latch. This signal is shaped at an output buffer 305 in a manner to meet external specifications and outputted to a bus called the critical bus. The delay time of the whole critical bus corresponds to the address access time of the memory LSI. A typical distribution of delay time of this bus is shown in FIG. 13.

Figure 12A:
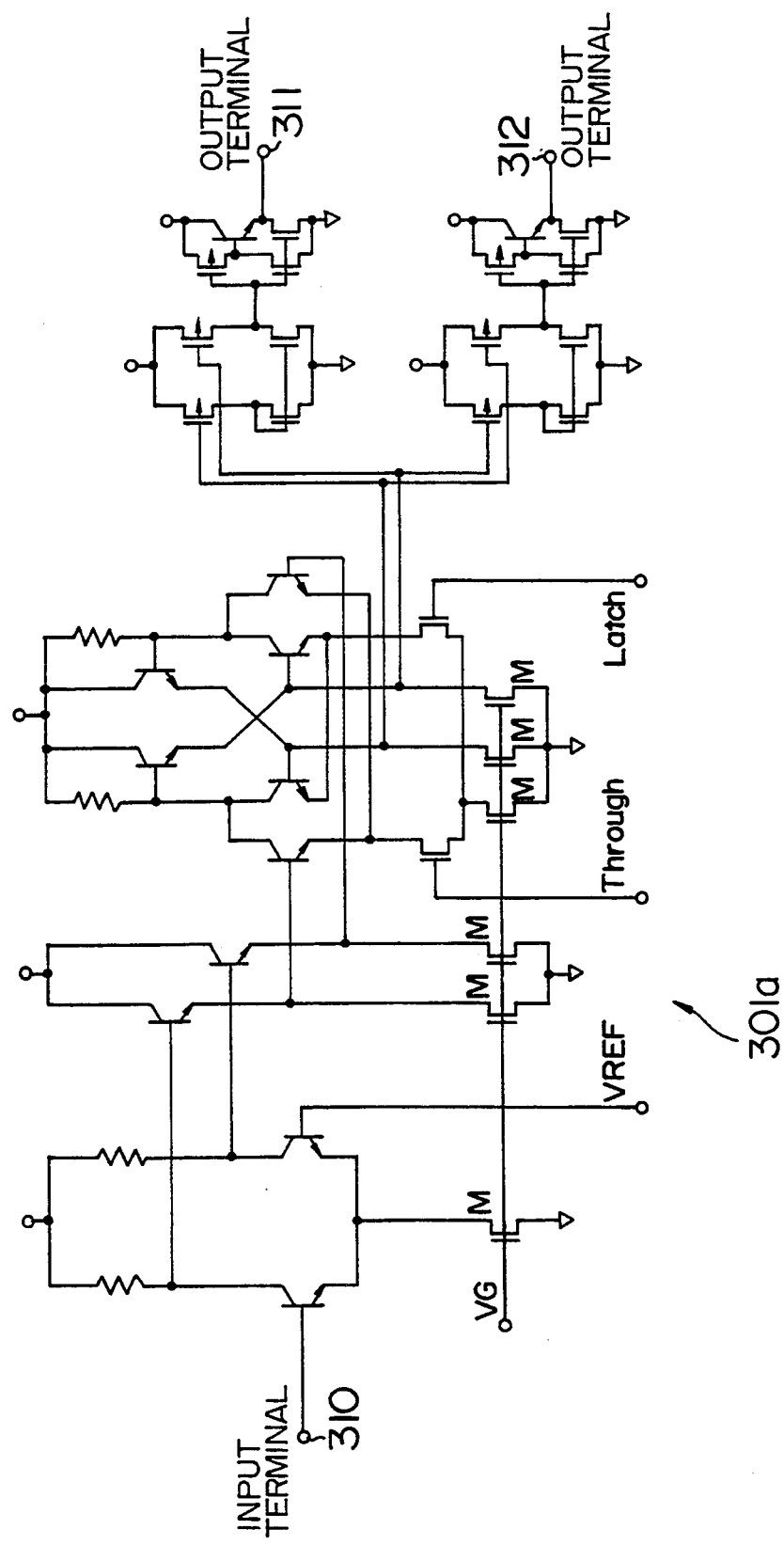
FIG. 12A is a circuit diagram showing an address buffer circuit having latch.

FIG. 12A shows a latch address buffer circuit having latch function. The latch address buffer circuit 301 receives input data from an input terminal 310 at a time indicated by a clock signal and holds the input data at one of output terminals 311, 312 up to a time indicated by a next clock signal. Specifically, the input data is directly outputted from one of the output terminals 311, 312 when a terminal Through is High and a terminal Latch is Low. When the terminal Through changing High to Low and the terminal Latch changing Low to High, a state of the input terminal 310 at the time is latched to hold a state of one of the output terminals 311, 312, so that it is possible to carry out a latch control by supplying the signals to the terminal Through and terminal Latch. A terminal VREF receives a reference voltage for the input data. A plurality of symbols M designate MOS transistors comprising a constant current source. A terminal VG receives a voltage for controlling the MOS transistors M.

A column decoder circuit 302a has a function which selects one column from 2 n columns corresponding to n-bit column addresses received through the latch address buffer circuit 301a, that is, one column is selected from the memory cell of $2^n$ columns comprising the memory cell array 303 in response to an n-bit column address signal.

The performance of a pipeline memory is determined by the cycle time. Generally, in realizing a pipeline operation with a logic circuit, latch circuits are inserted between circuit blocks constituting a data bus, and the circuits between the latch circuits are energized sequentially to transfer the data successively to the next-stage circuits. The period of this processing time is called the cycle time. Since the delay time of the whole critical bus is divided by latch circuits, the cycle time is reduced below the address access time thereby to achieve a high performance. The specification of cycle time, i.e., the minimum cycle time, is determined by a maximum value of delay time between latch circuits, and therefore it is recommended that latch circuits be arranged in the critical bus in such a manner as to reduce the delay time between latch circuits as uniformly as possible in order to eliminate the waste of the processing time.

A circuit using a bipolar transistor has an advantage of an improved operating speed due to a reduced time required for charge and discharge of the parasitic capacitance attached to the data bus since the signal amplitude can be reduced as compared with a CMOS circuit. A BiMOS memory LSI also uses a bipolar transistor in a memory cell and a sense amplifier to shorten the delay time as compared with the CMOS LSI. Even when a latch circuit is used only at a point of MOS amplitude as shown in FIG. 13, however, the circuit delay time between the latch circuit 401 in a decoder and the latch circuit 402 at the output of a sense amplifier represents a major portion of the entire delay time, thereby restricting the cycle time and preventing the reduction thereof.

Figure 14:
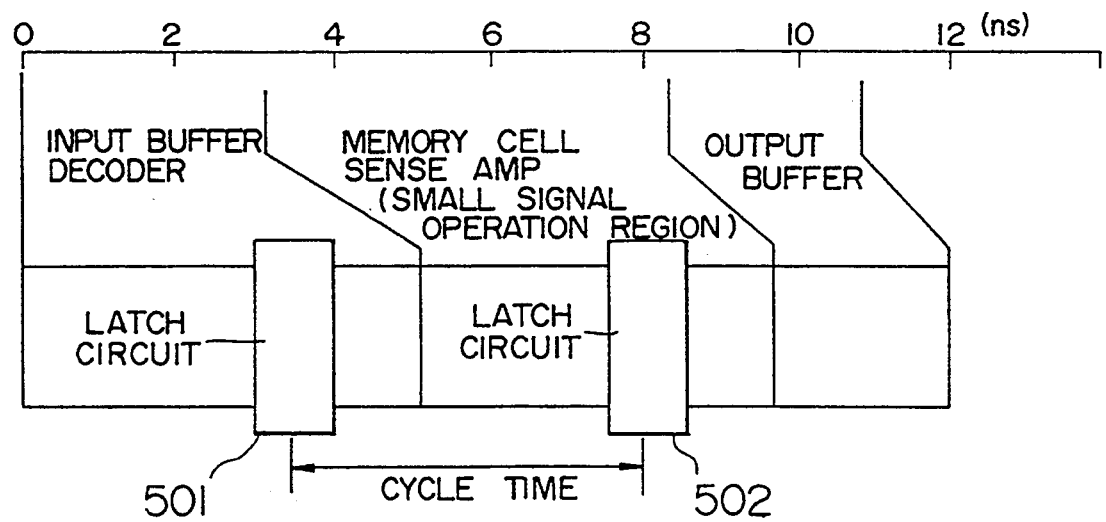
FIG. 14 is a diagram showing a cycle time of a memory of pipeline type according to the present invention.

According to the present embodiment, a small-signal latch circuit is inserted in a small-signal circuit of a sense amplifier using a bipolar transistor, thereby reducing the delay time of a decoder latch and a sense amplifier for a smaller cycle time. An example of delay time distribution of critical bus of a pipeline memory to which the present invention is applied is shown in FIG. 14.

The advantage of the present embodiment resides in the fact that the possibility of uniform distribution of the delay time of a circuit block constituting a critical bus between the latch circuits 501 and 502 inserted therein reduces the minimum value of cycle time and realizes a high-speed pipeline operation at the same time.

[Embodiment 10]

Figure 15:
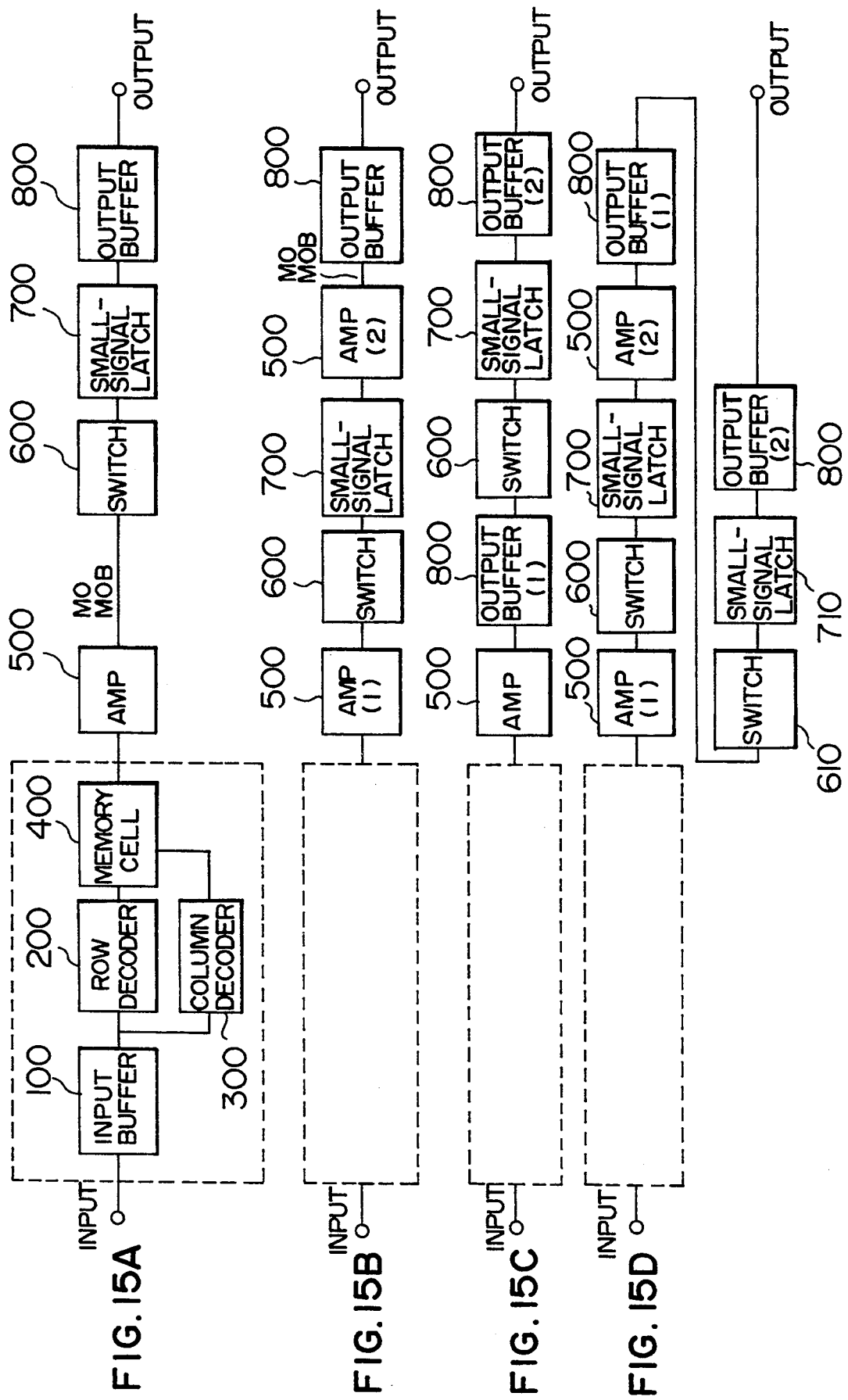
FIGS. 15A to 15D are block diagrams showing a DRAM circuit to which the present invention is applied.

The present invention as applied to the high-speed mode of DRAM will be explained. FIGS. 15A to 15D are circuit block diagrams showing a DRAM according to an embodiment of the present invention. Numeral 100 designates an input buffer circuit, numeral 200 an X decoder circuit connected to the input buffer circuit 100, numeral 300 a Y decoder circuit connected to the input buffer circuit 100, numeral 400 a memory cell circuit connected to the X decoder circuit 200 and the Y decoder circuit 300, numeral 500 an amplifier circuit connected to the memory cell circuit 400, numeral 600 a first switch circuit connected to the amplifier circuit 500, numeral 700 a first small-signal latch circuit connected to the first switch circuit 600, and numeral 800 an output buffer circuit connected to the small-signal latch circuit 700 circuit 600. The first small-signal latch circuit 700 has the function of temporarily holding the information stored in a memory cell at a signal level smaller than the output voltage (or current) level or an output signal amplitude level in the process of amplification to an output voltage (or current) level or an output signal amplitude level. FIG. 15A shows a fundamental configuration with the first small-signal latch circuit 700 interposed between the amplifier circuit 500 and the output buffer circuit 800, FIG. 15B a modification in which the first switch circuit 600 and the first small-signal latch circuit 700 are inserted in the amplifier circuit 500, FIG. 15C a modification in which the first switch circuit 600 and the first small-signal latch circuit 700 are inserted in the output buffer circuit 800, and FIG. 15D a modification in which the first switch circuit 600 and the first small-signal latch circuit 700 are inserted in the amplifier circuit 500 while at the same time inserting a second switch circuit 610 and a second small-signal latch circuit 710 in the output buffer circuit 800. A plurality of small-signal latch circuits may be inserted at any positions to the extent that the data held in the memory is in the process of being amplified to an output level, and the optimum position and number are determined by an intended cycle time.

Figure 16:
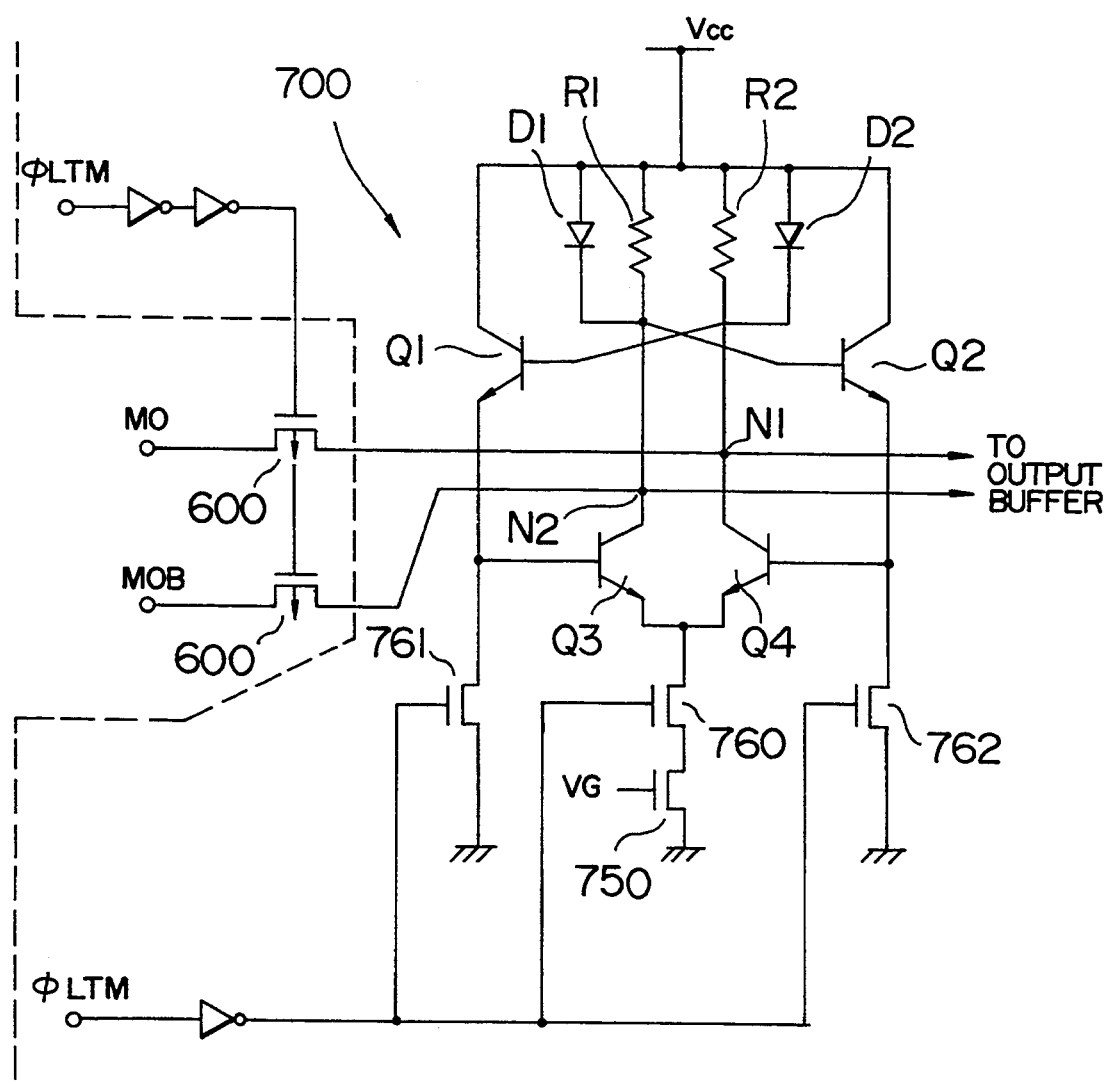
FIG. 16 is a circuit diagram showing a small signal latch circuit using the DRAM shown in FIG. 15.

FIG. 16 shows a specific example of the small-signal latch circuit 700. In FIG. 16, signals MO and MOB produced from an amplifier circuit 500 are applied through the first switch circuit 600 (a transfer MOS which is in on state in the present case) to the small-signal latch circuit 700. In normal mode, the small-signal latch circuit 700 fails to be energized (as the MOS transistors 760, 761 and 762 for energizing small-signal latch are off), and the applied signal is directly inputted to the output buffer circuit 800 in the next stage. The first switch circuit 600 is always turned on in normal mode.

Upon entering the high-speed mode, the first switch 600 is subjected to on-off control in response to the data output cycle. More specifically, the MO and MOB signals (one of which is at high level, and the other at low level) outputted from the amplifier circuit 500 are applied through the first switch circuit 600 (with the first switch circuit 600 initially turned on to the small-signal latch circuit 700. In the process, the latch-trigger MOS transistors 760, 761 and 762 are turned on thereby to latch the MO and MOB signals. When the MO and MOB signals are high and low levels respectively, for example, the base potential of the bipolar transistor Q1 (potential of node N1) is higher than the base potential (potential of node N2) of the bipolar transistor Q2. Upon the turning on of the latch-trigger MOS transistors 760, 761 and 762, therefore, the bipolar transistors Q1 and Q3 are turned on intensively, thereby causing a current flow in a resistor R1. The voltage drop across the resistor R1 reduces the base potential of the bipolar transistor Q2, thereby interfering with the operation of the bipolar transistors Q2 and Q4. As a result, little current flows in the resistor R2, and the potential of the node N1 is fixed to a value near to the source voltage Vcc. To the extent that the latch-trigger MOS transistors 760, 761 and 762 are On, the relationship in which the potential of the node N1 is higher than that of the node N2 is held even when the MO and MOS signals are turned off. Specifically, the data is latched. The MOS transistor 750 is a constant-current source.

After the data is latched, the switch circuit 600 turns off, with the result that the amplifier circuit 500 and the small-signal latch circuit 700 are isolated from each other. The data latched in the small-signal latch circuit 700 is inputted to the output buffer circuit, and after being amplified, is outputted. While this data is being outputted, the next data (second data) is read from the memory cell and is amplified at the amplifier circuit 500. Before the end of the first output cycle, the second data has been sufficiently amplified, the first data released from latched state, and the switch circuit 600 turned on. Also, the second data is passed through the small-signal latch circuit 700 into the output buffer circuit 800. At the same time, the MOS transistors 760, 761, 762 for triggering small signals are turned on again and the second data is latched. At the end of output of the second data applied to the output buffer circuit 800, the first cycle is completed and the second cycle begins. In similar fashion, the data held in the memory cells are outputted sequentially in high-speed cycles.

Figure 17:
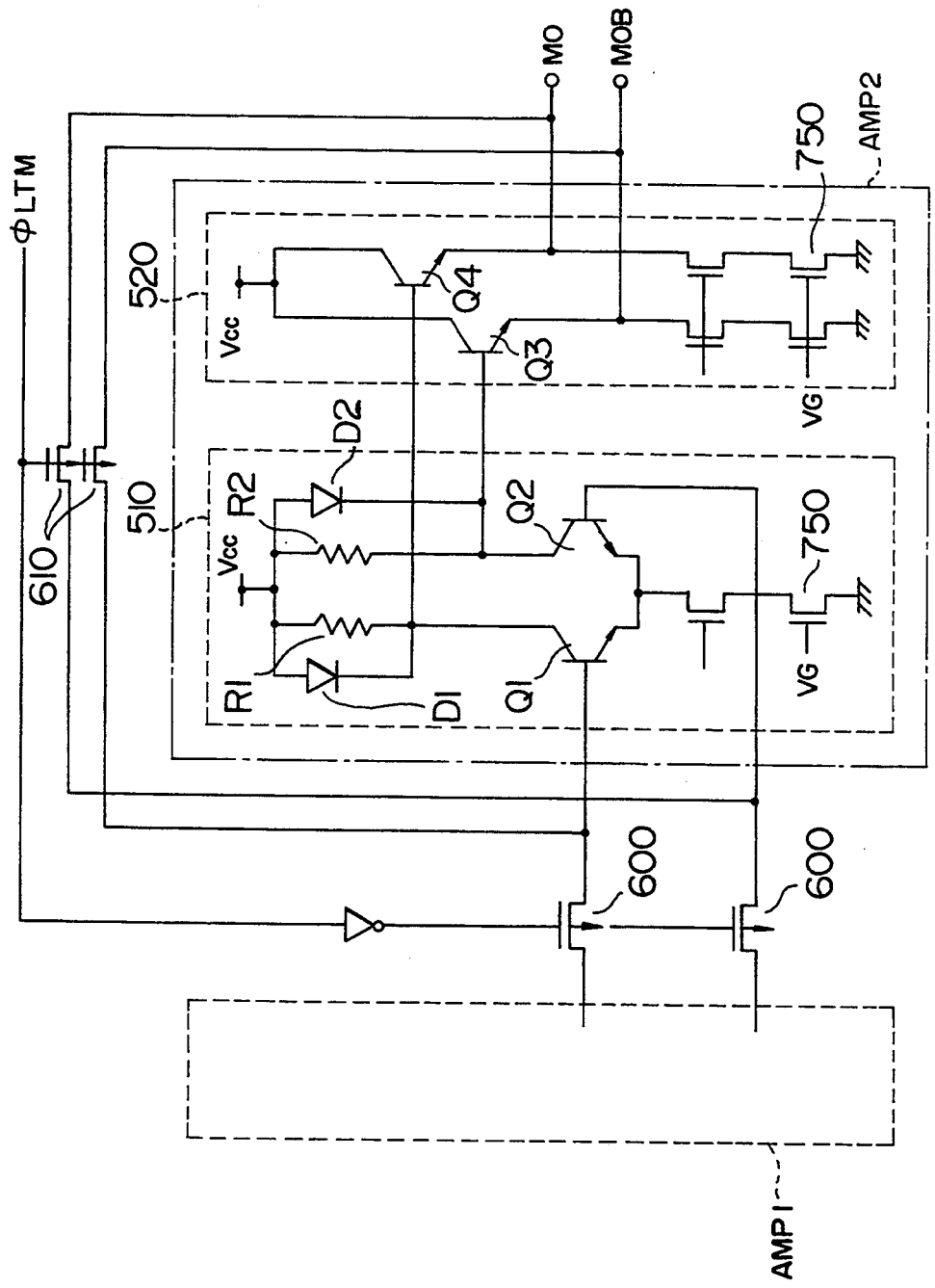
FIG. 17 is a circuit diagram showing a small signal latch circuit according to another embodiment of the present invention.

Another small-signal latch circuit is shown in FIG. 17. In FIG. 17, numeral 510 designates a bipolar differential amplifier circuit, numeral 520 an emitter-follower circuit, numeral 600 a MOS transistor functioning as a first switch circuit as in FIG. 16, numeral 610 a MOS transistor functioning as a latch control switch for determining "latch" or "through", and a latch-through control signal $\phi_{LTM}$ a signal for controlling "latch" and "through" states.

The supplying manner of the latch-through control signal $\phi_{LTM}$ is not limited, the signal $\phi_{LTM}$ being supplied from an external pin or the signal $\phi_{LTM}$ being pin. The signal $\phi_{LTM}$ can also be generated by logically combining plural address selection signals, such as RASB signal and CASB signal. In any cases above, first data is outputted after several cycles from first clock, afterward, the following data is outputted with the same cycle as the clock cycle.

The feature of this circuit lies in that a latch control switch 610 is added to the differential amplifier circuit 510 and the emitter-follower circuit 520 used as a part of the amplifier circuit and the output potential of the emitter-follower is fed back to the base of the bipolar transistor of the differential amplifier circuit 510 thereby to realize a small-signal latch. This circuit thus has the dual function of an amplifier and a latch circuit.

MOS transistors 750 comprise a current switch circuit to supply a constant current having less temperature dependency to an emitter-follower circuit, so that variation of circuit characteristics caused by external influences can be reduced in small. Amp 1 and Amp 2 designate an amplifier circuits. In the amplifier circuits Amp 1 and Amp 2, an output signal from the memory cell is inputted to the amplifier circuit Amp 1, but in the case that an amplitude of a signal outputted from the amplifier Amp 1 is insufficient, the amplifier circuit Amp 2 amplifiers the signal to obtain a sufficient amplitude.

Figure 18:
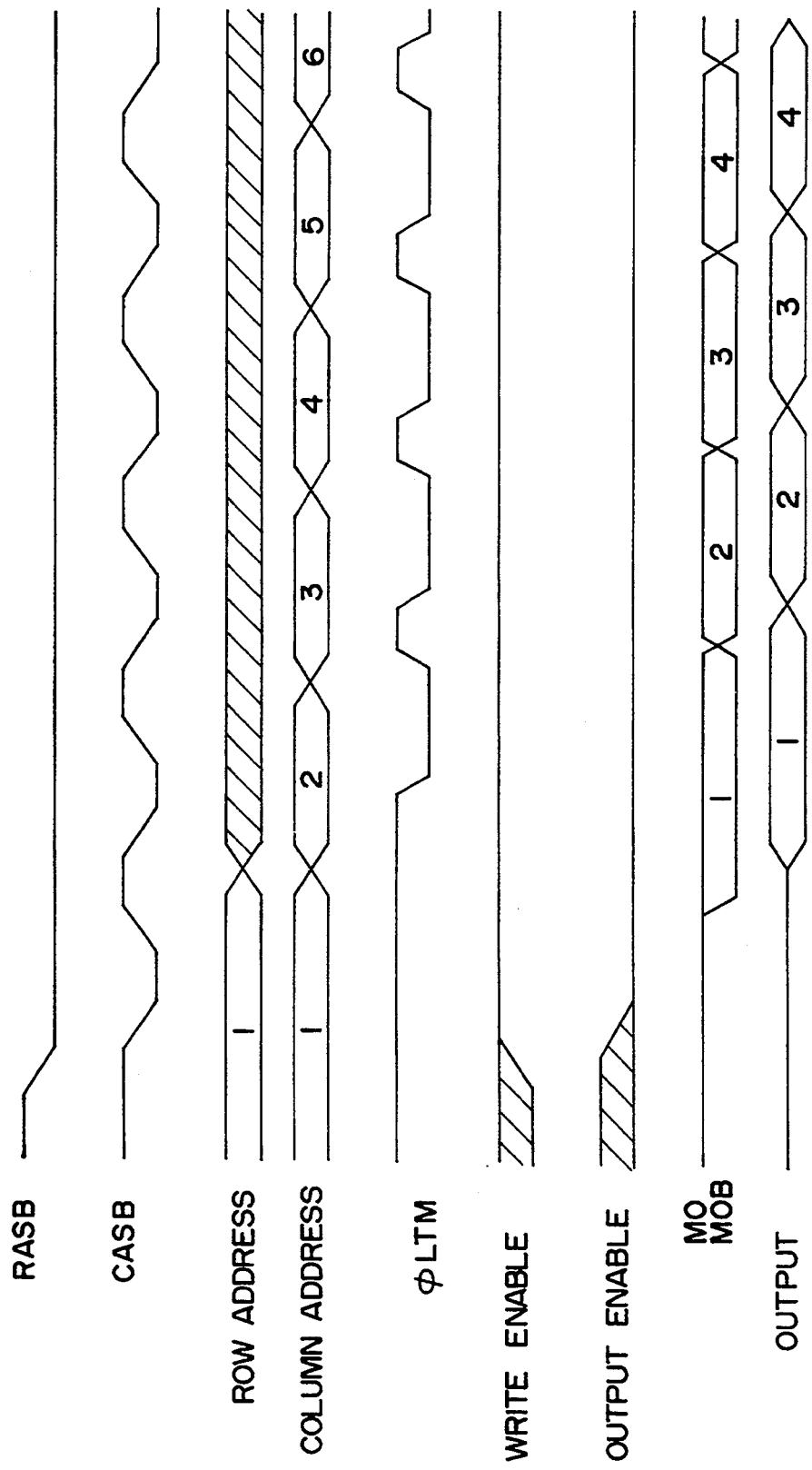
FIG. 18 shows a clock signal for operating the DRAM of FIG. 15 in a high-speed page mode.

Now, explanation will be made about a case in which the high-speed mode applied to the present invention is a page mode. FIG. 18 shows clock signals for the high-speed page mode according to the present invention. A row address selection signal RASB and a column address selection signal CASB turn from high to low level, and one row address and one column address are selected. After that, while the RASB signal holds a low level and the column address fixed, the CASB signal alternates between high and low levels repeatedly, each time of which a column address is received. In the process, with a delay time of 1 ns to 20 ns from the rise or fall of the CASB signal, the gate voltage of the switch circuit 600 is controlled to turn on and off the switch. The relationship between the data latch/transfer and the on-off of the switch circuit was explained already.

With regard to the relationship between data latch and output data, the next address is received before a data is outputted, and while the first data is being outputted, the second data is amplified to a level sufficiently high to be applicable to the latch circuit thereby to ready for output, thus realizing a high-speed cycle.

Figure 19:
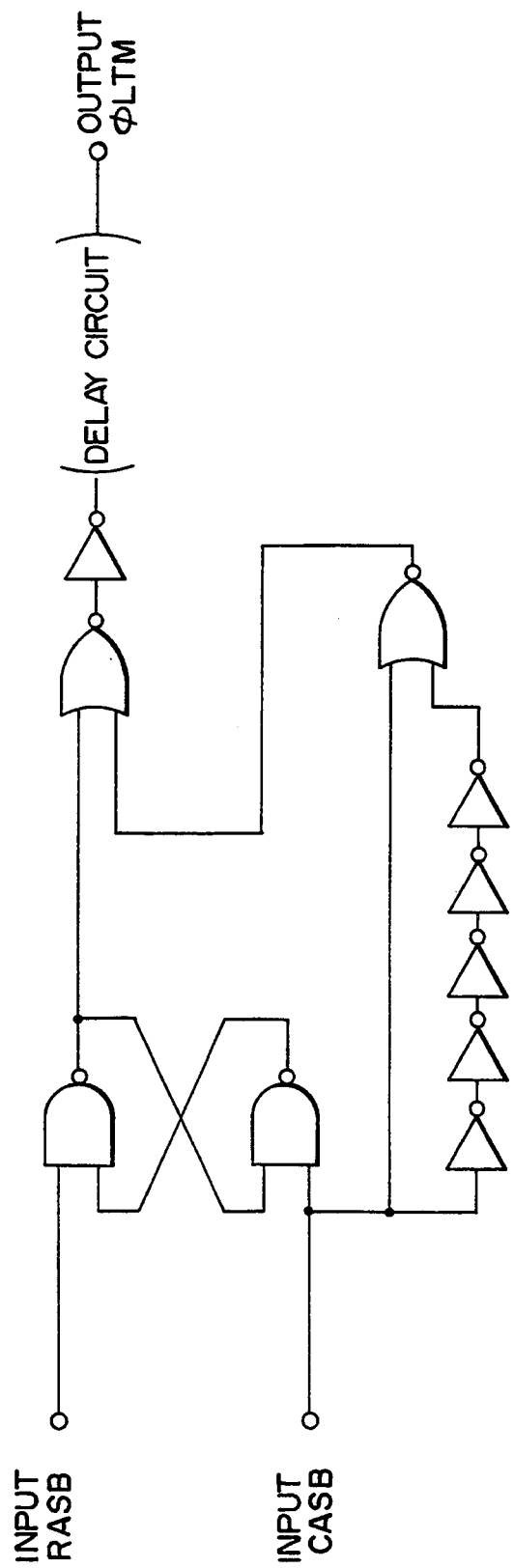
FIG. 19 shows a logic diagram of a switch circuit for the DRAM shown in FIG. 15.

Now, explanation will be made about a method of controlling the first switch circuit 600 and the latch control switch MOS transistor 610 (or the latch-trigger MOS transistors 760, 761, 762 shown in FIG. 16) in normal and high-speed modes. FIG. 19 is logic diagram showing a circuit for controlling the gate voltage of a transfer MOS transistor used as the first switch circuit 600 and the second switch circuit 610 shown in FIG. 15. The RASB signal and the CASB signal constitute a logic. As shown in FIG. 16 and FIG. 17, an output of the latch-through control signal $\phi_{LTM}$ is applied to the gates of the latch control switch MOS transistor 610, the latch-trigger MOS transistors 760, 761, 762 and an inverted signal of the signal $\phi_{LTM}$ to the first switch circuit 600. When both the RASB and CASB signals are high level, the signal $\phi_{LTM}$ is also high level. Under this condition, the transfer MOS transistor 600 constituting the first switch circuit shown in FIG. 17 is turned on, and the transfer MOS transistor 610 (or the latch-trigger MOS transistors 760,761, 762) making up the second switch circuit turned off. The signal $\phi_{LTM}$ remains unchanged even when the RASB signal turns to low level.

In the case where the RASB signal remains low level while the CASB signal turns to low and then to high level, the signal $\phi_{LTM}$ changes to low level only after the lapse of a predetermined length of delay time. The transfer MOS transistor 610 constituting the second switch circuit or the latch-trigger MOS transistors 760, 761, 762 are turned on, while the transfer MOS transistor 600 making up the first switch circuit turns off. At the same time, the data is latched and electrically isolated from the circuits in the preceding stages. In subsequent high-speed modes, the transfer MOS transistor 610 or the latch-trigger MOS transistors 760, 761, 762 are turned off while the transfer MOS transistor 600 turns on for a predetermined length of time each time the CASB signal rises in FIG. 17. The latched state is thus cancelled to enter a provisional "through" state. In the process, the next data is inputted through the transfer MOS transistor 600. After a predetermined time, the transfer MOS transistor 610 or the latch-trigger MOS transistors 760, 761, 762 are turned on again, and the transfer MOS transistor 600 turned off, so that the data is latched and electrically isolated from the circuits in the preceding stages.

In this way, in normal mode (even when the CASB signal turns to low and then to high level, the RASB signal is restored to high level before the CASB signal turns to low level again), the transfer MOS transistor 600 constituting the first switch circuit remains "On" so that the data continues to be outputted as it is. Upon entering a high-speed mode, the transfer MOS transistors 600, 610 or the latch-trigger MOS transistors 760, 761, 762 alternately turn on and off. A high-speed pipeline page mode can be realized by performing this turning on-off operation in synchronism with the data output of an amplifier with an appropriate delay time (about 1 ns to 20 ns) from the CASB signal.

In the embodiment, the latch-through control signal $\phi_{LTM}$ is generated by logically combining RASB signal and CASB signal, but the signal $\phi_{LTM}$ can be supplied from an external pin, and can also be generated from clock signal received from the external pin.

Reference has been made above to a case in which the pipeline memory used with a small signal latch circuit of the present invention is applied to a high-speed page mode of an address multi-type DRAM having a row address selection signal and a column address selection signal. Nevertheless, the present invention is applicable also to an address non-multi-type DRAM with equal effect. In the address multi-type DRAM, a row address and a column address are taken in at the same time at the fall of a chip-trigger signal CEB (as will be described in detail with reference to FIG. 20B). In order to effect a page mode with an address non-multi-type DRAM, it is necessary to prepare a CASB signal (as will be described in detail with reference to FIG. 20B) and to form a logic of a CASB signal and a CEB signal to control the address introduction under normal and page modes.

Figure 20A:
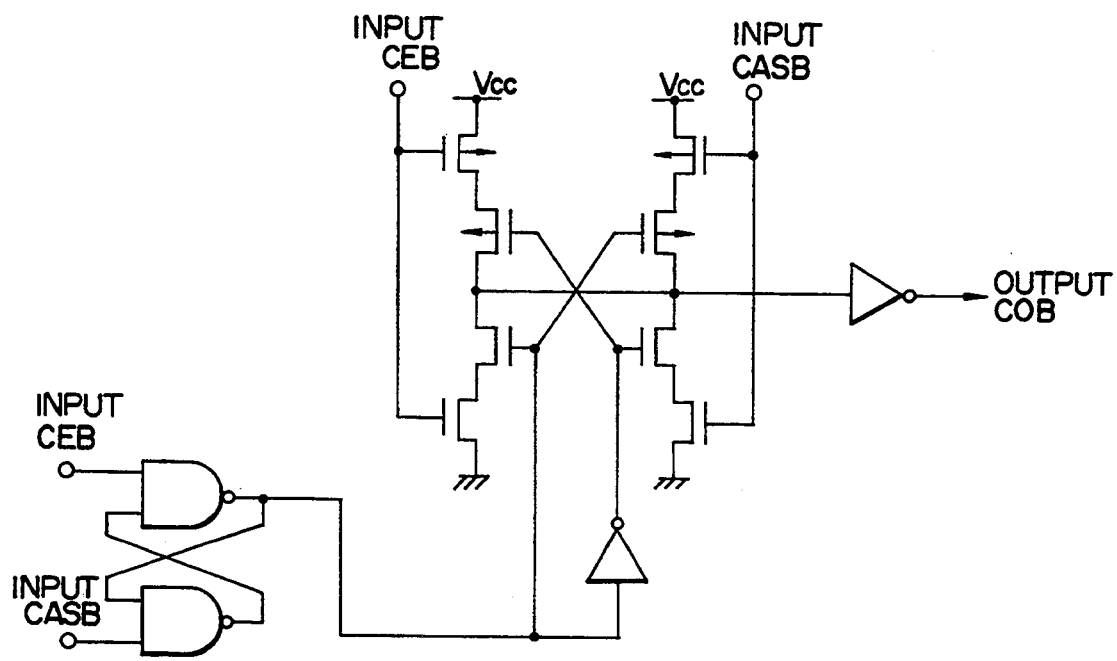
FIGS. 20A and 20B show Y-address receiving control circuits and waveforms of operation timings for the DRAM shown in FIG. 15.
Figure 20B:
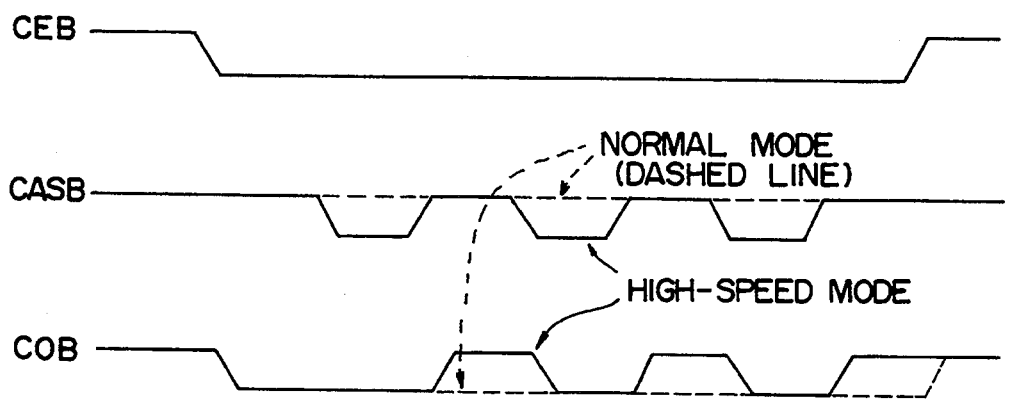

FIG. 20A shows a Y address introduction control circuit, and FIG. 20B timing waveforms of operation thereof. A logic is formed by a CEB signal and a CASB signal to prepare a CoB signal. A Y address signal is introduced at the fall of the CoB signal. The CoB signal turns to low level at the fall of the CEB signal, and the first row and column addresses are taken in at the fall of the CEB signal. In normal mode, the CASB signal is fixed to high level, and therefore the CoB signal remains "low" (See the dotted portions in the drawing), so that the next address is not introduced. With the fall of the CASB signal after the fall of the CEB signal, a high-speed mode is entered. From the second fall of the CASB signal, the CoB signal behaves the same way as the CASB signal, so that the Y address is introduced each time of fall of the CASB signal.

Figure 21A:
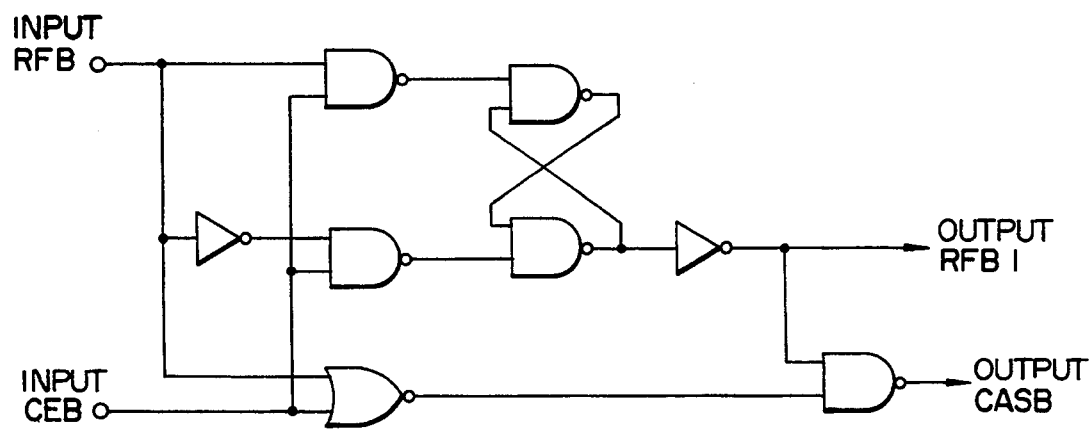
FIGS. 21A to 21C are diagrams showing waveforms of operation timings and a logic circuit incorporating the functions of a CASB control signal into a refresh control signal of the DRAM shown in FIG. 15.
Figure 21B:
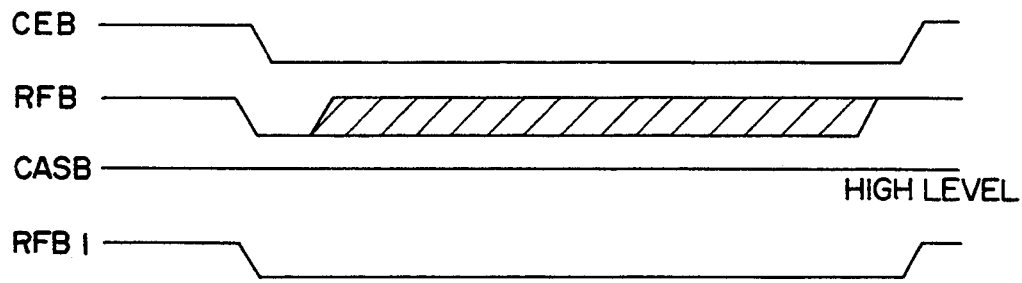
Figure 21C:
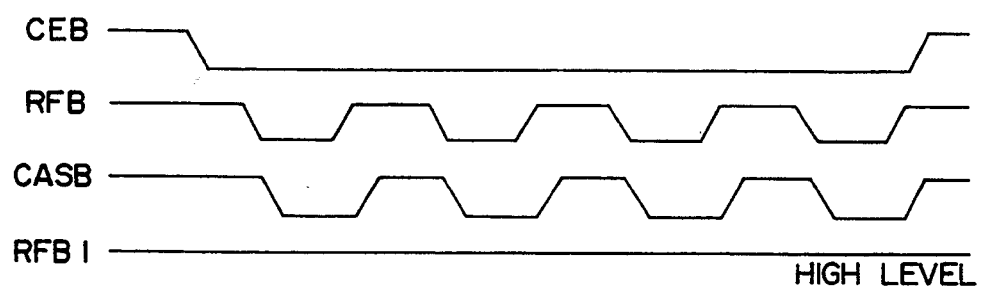

FIG. 21A shows a logic circuit diagram in the case where the function of the CASB signal is incorporated into a refresh control signal RFB, and FIGS. 21B and 21C waveforms of operation timings. The output RFB1 signal is used for refresh control, and the output CASB signal as an input signal CASB in FIG. 20A. As shown in FIG. 21B, in the case where the RFB signal falls before the CEB signal, a refresh mode is entered. In this case, the output CASB signal is fixed to high level, and as far as the CEB signal remains at low level, the output RFB1 signal is fixed to low level. As shown in FIG. 21C, if the RFB signal falls after the CEB signal, a high-speed mode is started, so that the RFB1 signal is fixed to high level with the output CASB signal behaving like the RFB signal. As a result, it is possible to introduce a clock signal of the desired cycles into the RFB signal to take in an address. In this way, a high-speed page mode is realized by use of an address non-multi means without any output CASB signal pin in FIG. 21A.

Apart from the page mode described above, the present invention is applicable also to the static column mode if a clock signal for controlling the first and second switch circuits 600 and 610 and the latch trigger is formed by used of a high-speed ATD (Address Transition Detection) circuit. Also, it is obvious that the pipeline memory used with a small-signal latch circuit of the present invention may be applied with equal effect to the serial mode for outputting a data corresponding to successive addresses by use of an address counter.

By applying the pipeline memory used with a small-signal latch circuit of the present invention to a 16M- or 64M-bit DRAM, a high-speed mode with a cycle time of 10 ns or less is realized.

[Embodiment 11]

Figure 22:
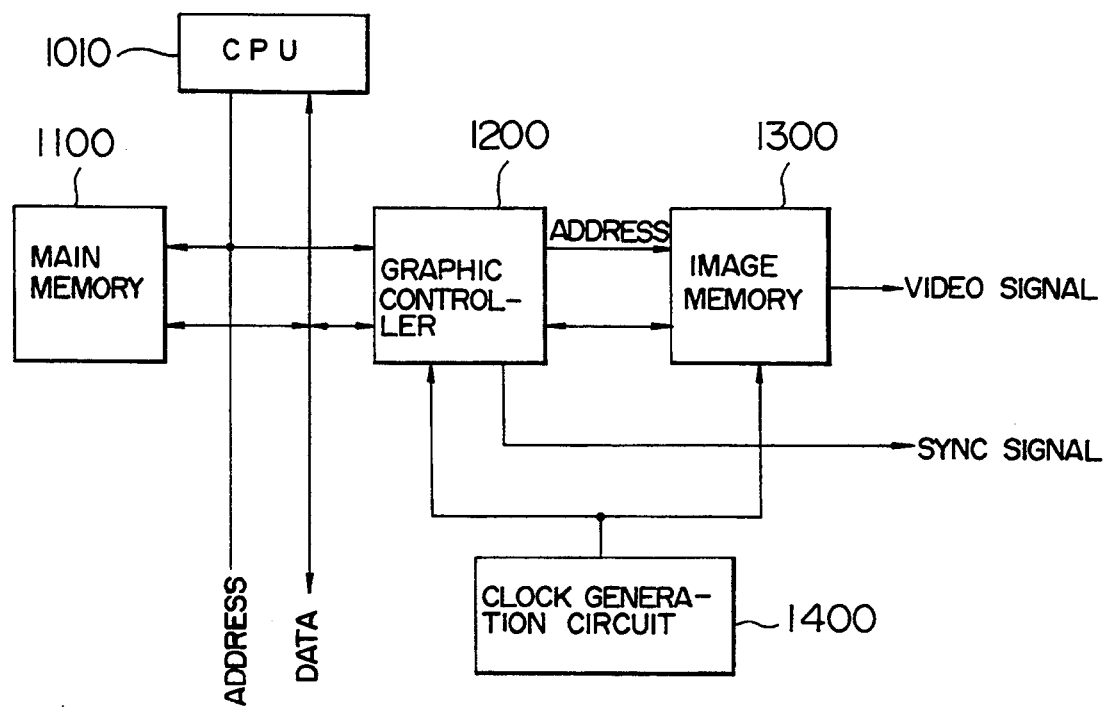
FIG. 22 is a block diagram showing an image memory circuit to which the present invention is applied.
Figure 23:
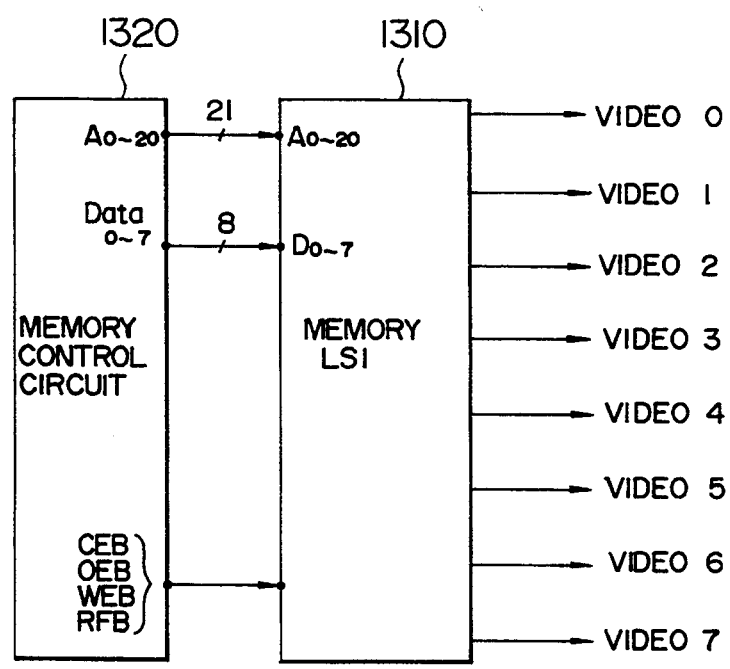
FIG. 23 shows a graphic system using the image memory in FIG. 22.

An image memory and a graphic system using the image memory according to an embodiment of the pipeline memory used with a small-signal latch circuit of the present invention are shown in FIGS. 22 and 23.

In FIGS. 22 and 23, a graphic system comprises a CPU 1010, a main memory 1100, a graphic controller 1200, an image memory 1300 and a clock generator circuit 1400. The CPU 1010 is for controlling the entire system in accordance with a program stored in the main memory 1100 which has stored therein various data in addition to the program. The graphic controller 1200, in compliance with a control signal from the CPU 1010, controls the plotting for generating patterns on the image memory and the displaying for reading the image memory 1300 in synchronism with the raster scan of a CRT sequentially, and generates a sync signal.

The image memory 1300 includes a memory LSI 1310 and a memory control circuit 1320 shown in FIG. 23. The memory LSI 1310 stores information equivalent to eight memory planes of 2048 dots×1024 dots and 2M×8 bits. Specifically, eight video signals are formed, and a 256-color display is realized by combinations of the video signals. The memory control circuit 1320 is for applying and receiving addresses and data to and from an external source, and also generating an address for the memory LSI 1310 and various control signals including a data buffer and an address selection signal.

[Embodiment 12]

Figure 24:
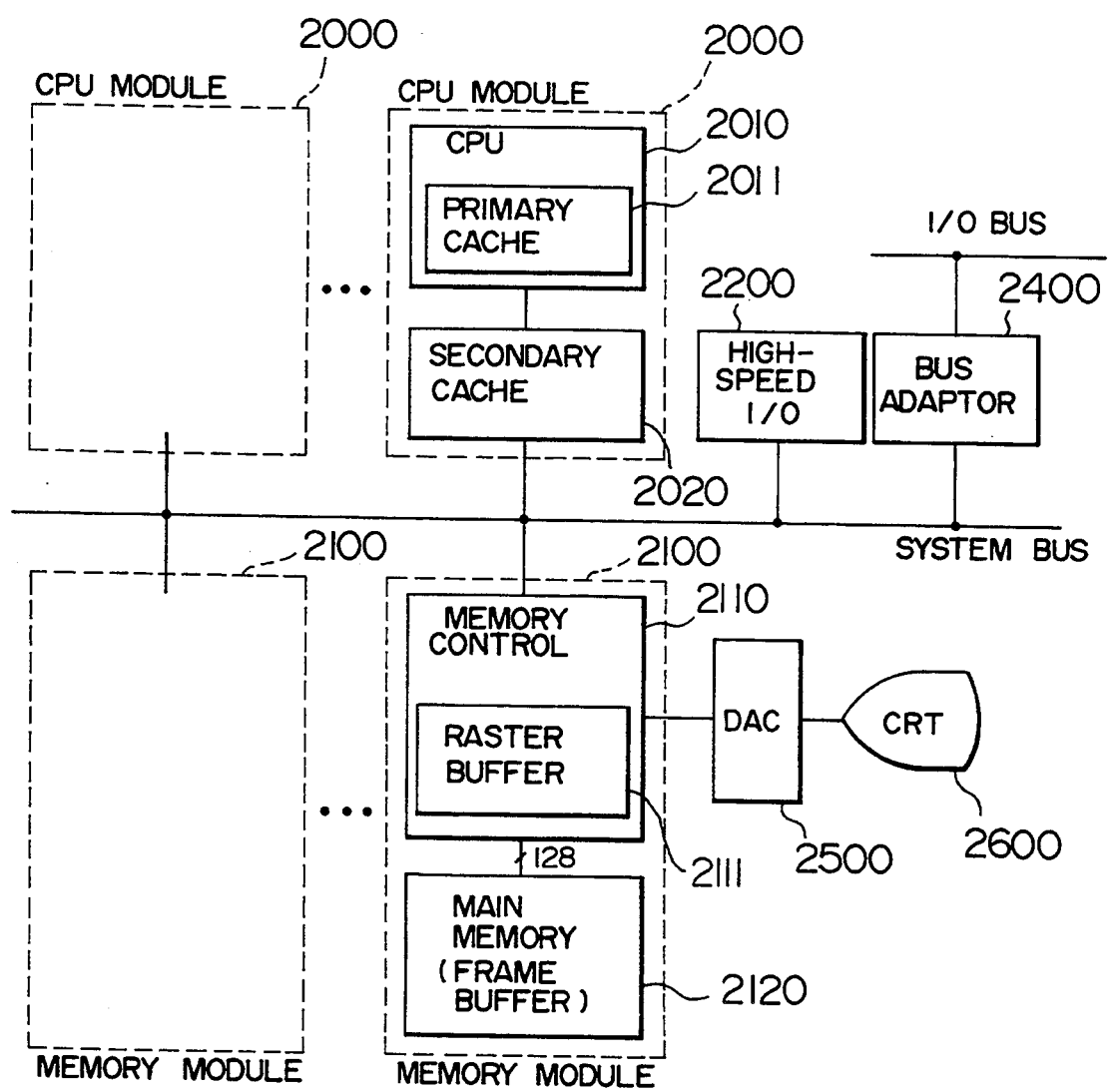
FIG. 24 is a diagram showing an image-processing system to which the present invention is applied.

FIG. 24 shows an image processing system according to an embodiment of the pipeline memory used with a small-signal latch circuit of the present invention.

In FIG. 24, the image processing system comprises one or a plurality of CPU modules 2000, one or a plurality of memory modules 2100, a high-speed I/O 2200, a bus adaptor 2400, a D/A converter 2500 and a CRT 2600. The CPU module 2000, the memory module 2100, the high-speed I/O 2200 and the bus adaptor 2400 are connected through a 64-bit wide high-speed system bus. The CPU module 2000 includes a CPU module for arithmetic operation and an externally-connected large-capacity secondary cache 2020. The CPU 2010 is a one-chip LSI, and has built therein a primary cache 2011, a floating point processing mechanism (not shown), a memory control unit (not shown), etc. This CPU 2010 has a performance of at least 100 MIPS (performance indicator of the number of instructions in millions executable per second). The memory module 2100 includes a memory control circuit 2110 and a main memory 2120 having the frame buffer function. The memory control circuit 2110 includes therein a raster buffer 2111 for buffering a data, and controls the access of the main memory 2120 while controlling the display data output at the same time. The main memory 2120 uses 32 memory chips of 16M (4M×4) bits to which the pipeline memory used with a small-signal latch circuit of the present invention is applied. The high-speed I/O 2200 has various I/O devices directly coupled to a system bus, including a high-speed network controller and a high-speed disk system. The bus adaptor 2400 is for connecting a high-speed system bus and a low-speed I/O bus. The low-speed I/O bus is connected with a printer, a keyboard, a mouse or the like external storage, and a controller like a network. The D/A converter 2500 has built therein a color pallet for color code conversion and a D/A converter means for converting a digital video signal into an analog video signal. The CRT 2600 is a display unit of raster scan type and has 1280×1024 picture elements.

The cycle time for random access of the conventional DRAM is generally about 120 to 200 ns. For a memory cycle of 120 ns and a bus width of 32 bits, for example, a bus transfer speed of 33 MB/s is obtained. For reading the display, on the other hand, assuming that 256 colors of display is made on a display unit of 1280×1024 picture elements at the same time, a throughput of at least about 80 MB/s is required. Specifically, in the conventional general memory design, the throughput required for display is far greater than that required for the processor to access the main memory 2120, resulting in the need of an exclusive frame buffer. When the processor performance exceeds the order of 100 MIPS as shown in the embodiment of FIG. 24, however, an efficient operation of the processor requires the ability of the main memory 2120 to supply a program or data with a throughput of several hundreds of MB/s. Specifically, a higher throughput is inevitably required for the display memory access than for the access from a processor.

The worst memory cycle of a high-speed mode of the DRAM according to the present invention is 20 to 25 ns. Therefore, a transfer rate of 400 to 320 MB/s is realized for the bus width of 64 bits, and 800 to 640 MB/s for the bus width of 128 bits. As a result, the requirement of the image processing system shown in FIG. 24 is sufficiently met.

Figure 25:
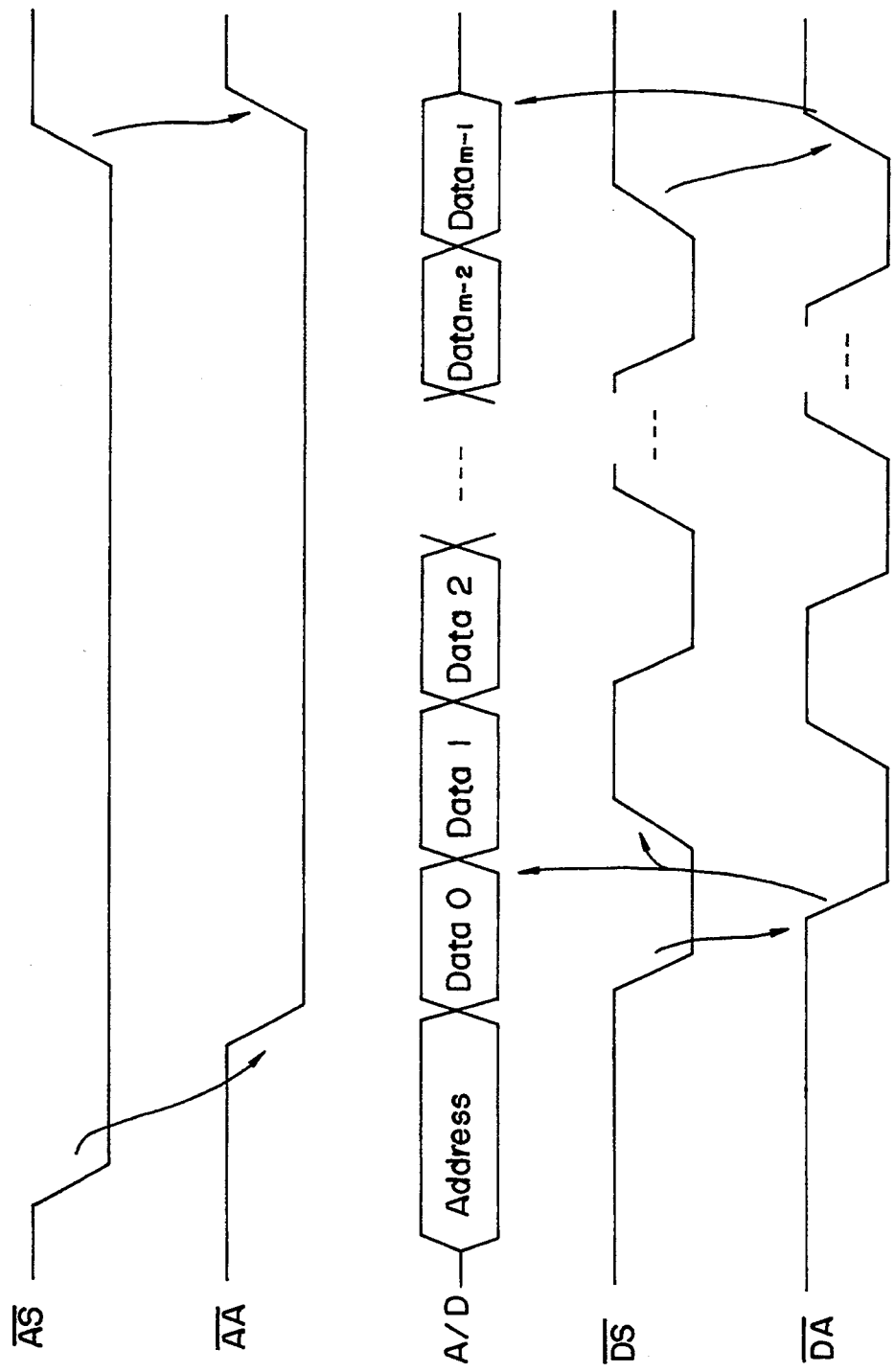
FIG. 25 shows waveforms of operation timings for high-speed system buses.

FIG. 25 is a diagram for explaining the operation of a high-speed system bus. In order to improve the performance, transfer is made for each number m of blocks. It is seen that an address is supplied to an A/D (address/data) bus by the fall of of an $\overline{AS}$ (address selection) signal from a bus master, thereby starting a transfer cycle. A response is made at the fall of an $\overline{AA}$ (address acknowledgment) signal from slave side, followed by data transfer. The data transfer is controlled by a $\overline{DS}$ (data selection) signal and a $\overline{DA}$ (data acknowledgment) signal. The $\overline{DS}$ and $\overline{DA}$ signals have a meaning at the edges of both fall and rise. The $\overline{DS}$ signal notifies the presence of a data and the $\overline{DA}$ signal responds thereto. In this way, the data transfer by block improves the operating speed. Assuming that each data transfer cycle represents 25 ns, for example, it is possible to obtain a transfer rate of 20 MB/s at the peak with a 64-bit system bus.

It will thus be understood from the foregoing description that a semiconductor memory considerably shorter in cycle time than in the conventional memory systems and a latch circuit suitable for a semiconductor memory are realized according to the present invention.

We claim:

1. A latch circuit comprising:
a first power terminal;
a second power terminal of a potential different from that of said first power terminal;
first and second bipolar transistors having the collectors thereof connected through first and second resistors to said first power terminal, respectively, the emitters of said first and second bipolar transistors being connected to each other, on the one hand, and to said second power terminal through a series circuit including a first MOS transistor and a first constant current source, on the other hand, and the bases of said first and second bipolar transistors being connected to the collectors of said second and first bipolar transistors, respectively;
a third bipolar transistor having the collector thereof connected to the junction of the first bipolar transistor and the first resistor, and a fourth bipolar transistor having the collector thereof connected to the junction of said second bipolar transistor and said second resistor, the emitters of said third and fourth bipolar transistors being connected to each other, on the one hand, and to said second power terminal through a series circuit including a second MOS transistor and a second constant current source, on the other hand:
a data input terminal connected to each base of said third and fourth bipolar transistors;
a data output terminal connected to the junction of said first bipolar transistor and said first resistor, and another data output terminal connected to the junction of said second bipolar transistor and said second resistor;
a latch signal input terminal connected to the gate of said first MOS transistor; and
a through signal input terminal connected to the gate of said second MOS transistor.

2. A latch circuit according to claim 1, further comprising:
third and fourth MOS transistors, having a different channel conductivity type from that of said first MOS transistor, connected in series between said first power terminal and the emitters of said first and second bipolar transistors, said third MOS transistor having the gate thereof connected directly to the gate of said first MOS transistor and to said latch signal input terminal and said fourth MOS transistor having the gate thereof coupled to respond to the logical invert, through a first inverter, of a signal at said latch signal input terminal.

3. A latch circuit according to claim 2, further comprising:
fifth and sixth MOS transistors connected in series to each other, on the one hand, and together connected in parallel to the series circuit including said second MOS transistor and said second constant current source, on the other hand, said fifth MOS transistor having the gate thereof connected directly to said through signal input terminal and said sixth MOS transistor having the gate thereof coupled to respond to the logical invert, through a second inverter, of a signal at said through signal input terminal.

4. A latch circuit according to claim 3, further comprising:
seventh and eighth MOS transistors connected in series to each other, on the one hand, and together connected in parallel to the series circuit including said first MOS transistor and said first constant current source, on the other hand, said seventh MOS transistor having the gate thereof connected directly to said latch signal input terminal and said eighth MOS transistor having the gate thereof coupled to respond to the logical invert, of a signal at said latch signal input terminal.

5. A latch circuit comprising:
a first power terminal;
a second power terminal having a potential different from that of said first power terminal;
first and second bipolar transistors having the collectors thereof connected to said first power terminal through first and second resistors, respectively, the emitters thereof being connected to said second power terminal through a series circuit including a first MOS transistor and a first constant-current source, and the bases of said first and second bipolar transistors being connected to the collectors of said second and first bipolar transistors, respectively;

a third bipolar transistor having the collector thereof connected to the junction of said first bipolar transistor and said first resistor, and a fourth bipolar transistor having the collector thereof connected to the junction of said second bipolar transistor and said second resistor, the emitters of said third and fourth bipolar transistors being connected to each other, on the one hand, and to said second power terminal through a series circuit including a second MOS transistor and a second constant-current source, on the other hand;

third and fourth MOS transistors connected in series to each other and inserted between said first power terminal and the emitters of said first and second bipolar transistors, said third and fourth MOS transistors having a channel conductivity type different from that of said first MOS transistor;

fifth and sixth MOS transistors connected in series to each other, on the one hand, and together connected in parallel to the series circuit including said second MOS transistor and said second constant-current source, on the other hand;

a pair of data input terminals connected to the bases of said third and fourth bipolar transistors, respectively;

a data output terminal connected to the junction of said first bipolar transistor and said first resistor, and another data output terminal connected to the junction of said second bipolar transistor and said second resistor;

a latch signal input terminal connected to the gates of said first and third MOS transistors directly, on the one hand, and coupled to the gate of the fourth MOS transistor through a first inverter, on the other hand: and a through signal input terminal connected to the gates of said second and fifth MOS transistors directly, on the one hand, and to the gate of said sixth MOS transistor through a second inverter, on the other hand:

wherein said first and second inverters have logical thresholds that are set at a level higher than median values of voltage amplitude of the latch and through signals, respectively.

6. A latch circuit according to claim 5, further comprising:

seventh and eighth MOS transistors connected in series to each other, on the one hand, and in parallel to the series circuit including said first MOS transistor and said first constant-current source, on the other hand, the gate of said seventh MOS transistor being connected directly to said latch signal input terminal and the gate of said eighth MOS transistor being coupled to respond to the logical invert, of a signal at said latch signal input terminal.

7. A memory apparatus for a pipeline system comprising:

a memory array including a plurality of memory cell rows, a plurality of pre-sense amplifiers associated with the memory cell rows, respectively;

a plurality of output buffers associated with the pre-sense amplifiers, respectively;

first and second bipolar transistors inserted between the pre-sense amplifiers and the output buffers and being equal in number to the output buffers, said first and second bipolar transistors having the collectors thereof connected to a first power terminal through first and second resistors, respectively, the emitters thereof being connected to each other, on the one hand, and to a second power terminal of a potential different from that of said first power terminal through a series circuit including a first MOS transistor and a first constant-current source, on the other hand, the bases of said first and second bipolar transistors being connected to the collectors of said second and first bipolar transistors, respectively, and the commonly connected bases and collectors of said first and second bipolar transistors being connected to input terminals of the output buffers;

a third bipolar transistor having the collector thereof connected to the junction of said first bipolar transistor and said first resistor, and a fourth bipolar transistor having the collector thereof connected to the junction of said second bipolar transistor and said second resistor, the emitters of said third and fourth bipolar transistors being connected to each other, on the one hand, and to said second power terminal through a series circuit including a second MOS transistor and a second constant-current source, on the other hand, and the bases of said third and fourth bipolar transistors being connected to an output terminal of a respectively corresponding pre-sense amplifier;

a latch signal input terminal connected to the gate of said first MOS transistor; and a through signal input terminal connected to the gate of said second MOS transistor.

8. A memory apparatus according to claim 7, further comprising:

third and fourth MOS transistors, of a channel conductivity type different from that of said first MOS transistor, connected in series between said first power terminal and the emitters of said first and second bipolar transistors, said third MOS transistor having the gate thereof connected directly to the gate of said first MOS transistor and to said latch signal input terminal and said fourth MOS transistor having the gate thereof coupled to respond to the logical invert, through a first inverter, of a signal at said latch signal input terminal.

9. A memory apparatus according to claim 8, further comprising fifth and sixth MOS transistors connected in series to each other, on the one hand, and together in parallel to the series circuit including said second MOS transistor and said second constant-current source, on the other hand, the gate of said fifth MOS transistor being connected directly to said through signal input terminal and that of said sixth MOS transistor having the gate thereof coupled to respond to the logical invert, through a second inverter, of said through signal input terminal.

10. A memory apparatus according to claim 9, further comprising seventh and eighth MOS transistors connected in series to each other, on the one hand, and together in parallel to the series circuit including said first MOS transistor and said first constant-current source, on the other hand, the gate of said seventh MOS transistor being connected directly to said latch signal input terminal and said eighth MOS transistor having the gate thereof coupled to respond to the logical invert, to said latch signal input terminal.

11. A differential amplifier comprising:

a first power terminal;

a second power terminal of a potential different from that of said first power terminal;

first and second resistors each having a first end and a second end;

first and second bipolar transistors having the collectors thereof directly connected to the first ends of said first and second resistors, respectively, the second ends of said first and second resistors being directly connected to said first power terminal, respectively, the emitters of said first and second bipolar transistors being connected to each other, or the one hand, and being coupled to said second power terminal through a series circuit including a MOS transistor and a constant-current source, on the other hand, and the bases of said first and second bipolar transistors being connected to the collectors of said second and first bipolar transistors, respectively; and a control signal input terminal connected to the gate of said first MOS transistor, 12. A differential amplifier comprising:

a first power terminal;

a second power terminal of a potential different from that of said first power terminal;

first and second bipolar transistors having the collectors thereof connected to said first power terminal through first and second resistors, respectively, the emitters of said first and second bipolar transistors being connected to each other, on the one hand, and being coupled to said second power terminal through a series circuit including a first MOS transistor and a constant-current source, on the other hand and the bases of said first and second bipolar transistors being connected to the collectors of said second and first bipolar transistors, respectively, wherein the junction of said first bipolar transistor and said first resistor is associated with a first input-/output terminal of said differential amplifier and the junction of said second bipolar transistor and said second resistor is associated with a second input/output terminal of said differential amplifier;

a control signal input terminal connected to the gate of said first MOS transistor; and second and third MOS transistors, having a channel conductivity type different from that of said first MOS transistor, connected in series between said first power terminal and the emitters of said first and second bipolar transistors, the gate of said second MOS transistor being connected directly to said latch signal input terminal and said third MOS transistor having the gate thereof coupled to respond to the logical invert, through a first inverter, of a signal at said control signal input terminal.

13. A differential amplifier according to claim 12, further comprising fourth and fifth MOS transistors connected in series to each other, on the one hand, and together in parallel to the series circuit including said first MOS transistor and said first constant-current source, on the other hand, the gate of said fourth MOS transistor being connected directly to said control signal input terminal and said fifth MOS transistor having the gate thereof coupled to respond to the logical invert, through a second logic inverter, of a signal at said control signal input terminal.

* * * * *